US010281525B2

(12) United States Patent
Maeda et al.

(10) Patent No.: US 10,281,525 B2
(45) Date of Patent: May 7, 2019

(54) SEMICONDUCTOR DEVICE AND DIAGNOSTIC TEST METHOD FOR BOTH SINGLE-POINT AND LATENT FAULTS USING FIRST AND SECOND SCAN TESTS

(71) Applicant: Renesas Electric Corporation, Tokyo (JP)

(72) Inventors: Yoichi Maeda, Kodaira (JP); Jun Matsushima, Kodaira (JP); Takayuki Suzuki, Kodaira (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/547,440

(22) PCT Filed: Jun. 18, 2015

(86) PCT No.: PCT/JP2015/003047
§ 371 (c)(1),
(2) Date: Jul. 28, 2017

(87) PCT Pub. No.: WO2016/203505
PCT Pub. Date: Dec. 22, 2016

(65) Prior Publication Data
US 2018/0180672 A1 Jun. 28, 2018

(51) Int. Cl.
*G01R 31/3177* (2006.01)
*G01R 31/3185* (2006.01)
*G01R 31/317* (2006.01)

(52) U.S. Cl.
CPC ... *G01R 31/3177* (2013.01); *G01R 31/31725* (2013.01); *G01R 31/318555* (2013.01); *G01R 31/318566* (2013.01)

(58) Field of Classification Search
CPC ......... G01R 31/3177; G01R 31/31725; G01R 31/28
(Continued)

(56) References Cited

U.S. PATENT DOCUMENTS 7,301,836 B1 * 11/2007 Raghavan .......... G01R 31/3172
365/189.11
2006/0053356 A1 3/2006 Terai
(Continued)

FOREIGN PATENT DOCUMENTS

JP H 03-18777 A 1/1991
JP 05-313935 A 11/1993
(Continued)

OTHER PUBLICATIONS

International Search Report (ISR) (PCT Form PCT/ISA/210), in PCT/JP2015/003047, dated Sep. 8, 2015.
(Continued)

*Primary Examiner* — Cynthia Britt
(74) *Attorney, Agent, or Firm* — McGinn IP Law Group, PLLC

(57) ABSTRACT

A semiconductor device (1) according to the present invention includes a circuit to be tested (2) having a scan chain, and a first test control device (3) and a second test control device (4) that perform a scan test of the circuit to be tested by using the scan chain. The second test control device (4) performs a second scan test of the circuit to be tested (2), the circuit to be tested (2) gives the first test control device (3) an instruction to perform a first scan test after the second scan test is performed, and the first test control device (3) performs a first scan test of the circuit to be tested (2) in response to an instruction from the circuit to be tested (2).

20 Claims, 18 Drawing Sheets

(58) Field of Classification Search
USPC .......................................................... 714/726
See application file for complete search history.

(56) References Cited

U.S. PATENT DOCUMENTS

| | | |
|---|---|---|
| 2006/0259838 A1 | 11/2006 | Nardini et al. |
| 2009/0063921 A1 | 3/2009 | Aipperspach et al. |
| 2015/0293173 A1* | 10/2015 | Tsuboi ............... G01R 31/3177 714/727 |
| 2016/0349322 A1* | 12/2016 | Shibahara .......... G01R 31/3177 |
| 2018/0059183 A1* | 3/2018 | Maeda ................... G01R 31/28 |

FOREIGN PATENT DOCUMENTS

| | | |
|---|---|---|
| JP | H 11-101859 A | 4/1999 |
| JP | 2002-189063 A | 7/2002 |
| JP | 2003-068865 A | 3/2003 |
| JP | 2006-073917 A | 3/2006 |
| JP | 2006-303326 A | 11/2006 |
| JP | 2008-267999 A | 11/2008 |
| JP | 2011-094986 A | 5/2011 |
| JP | 2015-031534 A | 2/2015 |

OTHER PUBLICATIONS

Japanese Office Action, dated Jul. 3, 2018, in Japanese Application No. 2017-524143 and Partial English Translation thereof.
European Search Report dated Jan. 4, 2019, in the European Patent Application No. 15895526.0-1022/3312623.

* cited by examiner

SEMICONDUCTOR DEVICE AND DIAGNOSTIC TEST METHOD FOR BOTH SINGLE-POINT AND LATENT FAULTS USING FIRST AND SECOND SCAN TESTS

TECHNICAL FIELD

The present invention relates to a semiconductor device and a diagnostic test method and, particularly, relates to a technique to perform a scan test of a circuit to be tested.

TECHNICAL FIELD

Automobiles have become increasingly electrified and electronified in recent years, and semiconductor devices are used not only for body control like windows or lights but also for mechanisms that directly affect the safety of passengers and pedestrians, such as chassis control like brakes or steering and advanced driver assistance systems like clash avoidance today. For such semiconductor devices, a high level of safety is demanded for their functions. The automotive functional safety standard ISO26262 states the necessity of enhancing the safety depending on their application and social environment.

For example, one known measure is to incorporate, into a semiconductor device, a safety mechanism capable of detecting a single-point fault (SPF) which is a failure due to a single fault and a latent fault (LF) which is a failure due to the simultaneous occurrence of multiple faults. In other words, a semiconductor device with enhanced reliability capable of detecting both SPF and LF is demanded.

Patent Literature 1 discloses a control device that makes a diagnosis whether a processor is normal or not by performing the same computation in two processors, comparing computation results by a comparator to determine whether the computation results match or not. In addition, this control device further improves the reliability by diagnosing the comparator by BIST (Built-In-Self-Test). However, this control device does not disclose a technique to detect both SPF and LF without need for a plurality of circuits to be tested, as described later.

CITATION LIST

Patent Literature

PTL1: Japanese Unexamined Patent Application Publication No. 2008-267999

SUMMARY OF INVENTION

Technical Problem

As described above, there is a problem that a semiconductor device with enhanced reliability does not exist which is capable of detecting both SPF and LF without need for a plurality of circuits to be tested.

The other problems and novel features of the present invention will become apparent from the description of the specification and the accompanying drawings.

Solution to Problem

According to one embodiment, in a semiconductor device, after a second test control device performs a second scan test of a circuit to be tested, the circuit to be tested gives a first test control device an instruction to perform a first scan test.

Advantageous Effects of Invention

According to one embodiment described above, it is possible to provide a semiconductor device with enhanced reliability.

DESCRIPTION OF EMBODIMENTS

Preferred embodiments of the present invention will be described hereinafter with reference to the drawings. It should be noted that specific numerical values and the like in the following embodiments are given merely for illustrative purposes, and values are not limited thereto unless particularly noted. Further, in the following description and drawings, things that are obvious to those skilled in the art and the like are appropriately omitted, shortened and simplified to clarify the explanation.

<Overview of Embodiment>

Figure 1:
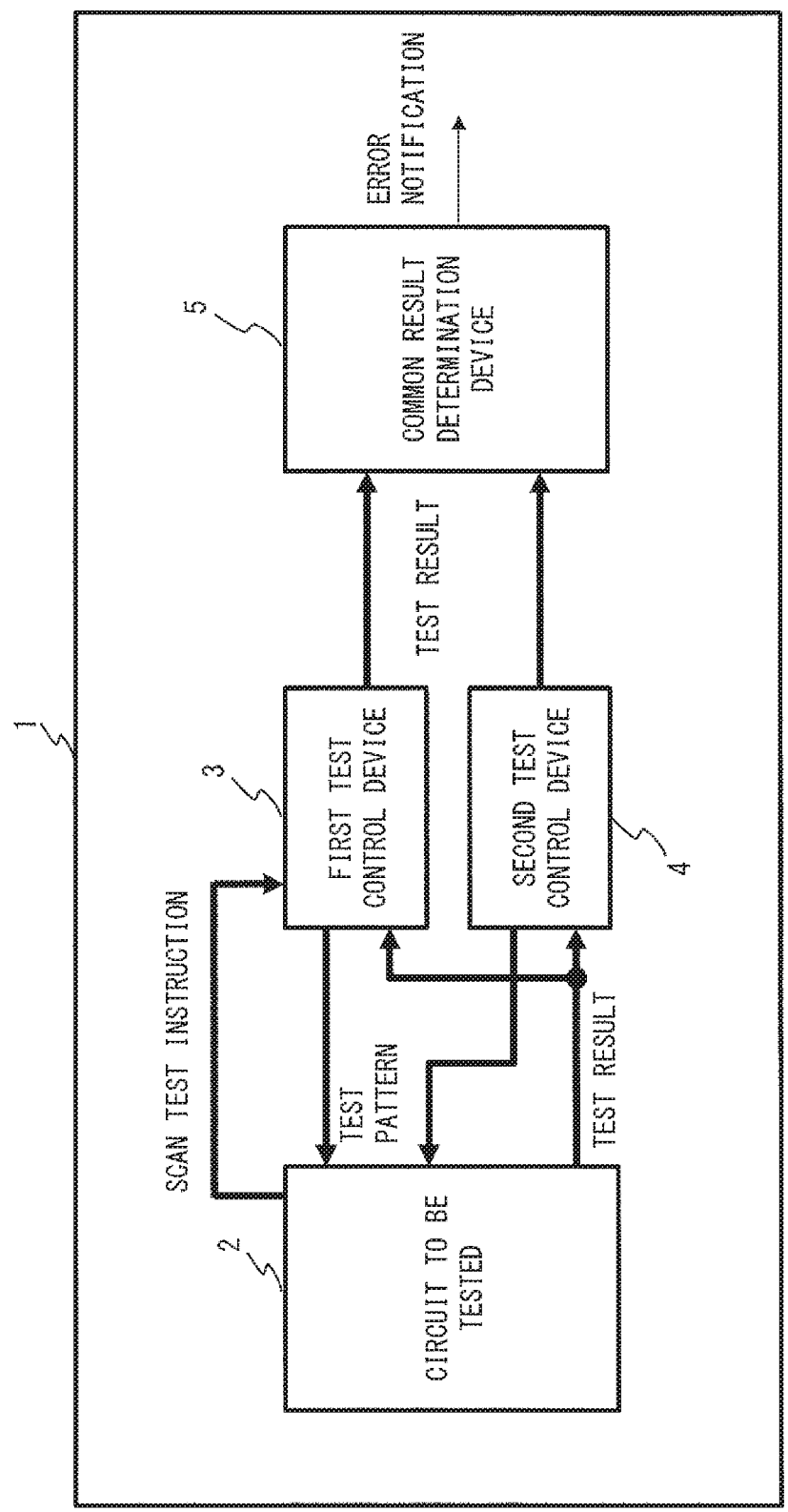
FIG. 1 is a block diagram showing the schematic configuration of a semiconductor device according to an embodiment.

The schematic configuration of a semiconductor device according to an embodiment, which is described later, is described hereinafter with reference to FIG. 1. FIG. 1 is a block diagram showing a semiconductor device, which is the overview of a semiconductor device according to an embodiment, which is described later.

A semiconductor device (1) includes a circuit to be tested (2), a first test control device (3), a second test control device (4), and a common result determination device (5).

The circuit to be tested (2) has a scan chain. Each of the first test control device (3) and the second test control device (4) uses the scan chain of the circuit to be tested (2) and performs a scan test of the circuit to be tested (2). The common result determination device (5) determines a test result of the circuit to be tested (2) obtained by a scan test performed by each of the first test control device (3) and the second test control device (4).

The second test control device (4) scans a test pattern into the scan chain of the circuit to be tested (2), causes the circuit to be tested (2) to operate in the test pattern, and scans a test result out of the scan chain of the circuit to be tested (2). The second test control device (4) outputs the test result to the common result determination device (5). Based on the test result output from the second test control device (4), the common result determination device (5) determines whether a fault is occurring in the circuit to be tested (2) or not.

The second test control device (4) performs a scan test of the circuit to be tested (2). After the second test control device (4) performs a scan test of the circuit to be tested (2), the circuit to be tested (2) gives the first test control device (3) an instruction to perform a scan test. In response to an instruction for a scan test from the circuit to be tested (2), the first test control device (3) performs a scan test of the circuit to be tested (2).

In this manner, by a scan test performed by the first test control device (3), it is possible to detect a fault (i.e., SPF) in the normal function of the circuit to be tested (2). Further, by a scan test performed by the second test control device (4), it is possible to detect a fault (i.e., LF) in the function to initiate a scan test by the first test control device (3). It is thereby possible to detect both SPF and LF and enhance the reliability of the semiconductor device (1).

<First Embodiment>

[Overall Configuration]

Figure 2:
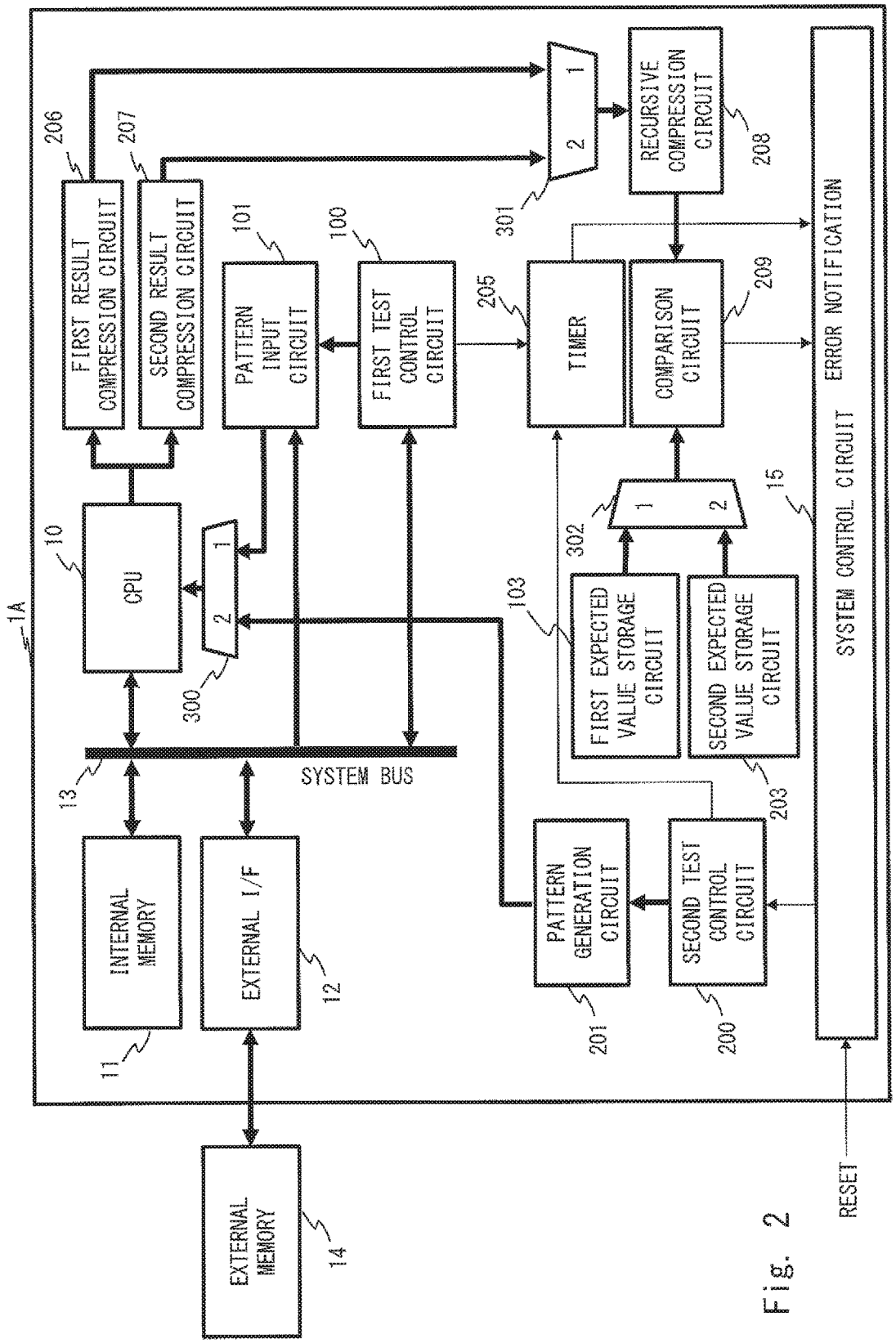
FIG. 2 is a block diagram showing the configuration of a semiconductor device according to a first embodiment.

A first embodiment is described hereinafter. The configuration of a semiconductor device (1A) according to the first embodiment is described hereinafter with reference to FIG. 2. FIG. 2 is a block diagram showing the configuration of the semiconductor device (1A) according to the first embodiment.

As shown in FIG. 2, the semiconductor device (1A) includes, as element for implementing its functions, a CPU (10), an internal memory (11), an external I/F (interface) (12), a system bus (13), and a system control circuit (15).

The CPU (10), the internal memory (11) and the external I/F (12) are connected with one another through the system bus (13). Thus, necessary data is transferred between the CPU (10), the internal memory (11) and the external I/F (12).

The CPU (10) runs an application program for the semiconductor device (1A) to operate. Accordingly, the application program contains a plurality of instructions for causing the CPU (10) to execute various processing to implement the functions in the semiconductor device (1A). The CPU (10) is an arithmetic circuit that runs the application program and thereby exercises control over the semiconductor device (1A).

In the first embodiment, it is assumed that the CPU (10) is a circuit to be tested. The CPU (10) has a plurality of scan chains. The CPU (10) can be diagnosed by a scan test with use of the plurality of scan chains.

The internal memory (11) is a storage circuit that stores data to be used by the CPU (10) to execute the various processing described above. Thus, the data contains the above-described application program, for example. The CPU (10) reads the data stored in the internal memory (11) and executes processing based on the read data. Further, the CPU (10) writes data generated by the execution of processing into the internal memory (11). The internal memory (11) is a volatile memory such as RAM (Random Access Memory), for example.

The external I/F (12) is connected also to an external memory (14) that is placed outside the semiconductor device (1A). The external I/F (12) is a circuit that transmits and receives data between the external memory (14) and the circuits (the CPU (10) etc.) connected to the system bus (13). Thus, the CPU (10) reads data stored in the external memory (14) and writes data to the external memory (14) through the system bus (13) and the external I/F (12).

The external memory (14) is a storage circuit that stores arbitrary data. The external memory (14) may also store data to be used by the CPU (10) to execute the various processing described above. For example, the external memory (14) may previously store the above-described application program. Then, the CPU (10) may load the application program stored in the external memory (14) to the internal memory (11) and run the program. Specifically, the CPU (10) may read data stored in the external memory (14) and execute processing based on the read data. Further, the CPU (10) may write data generated by the execution of processing to the external memory (14). The external memory (14) is a nonvolatile memory such as ROM (Read Only Memory) or FLASH memory, for example.

In the first embodiment, a plurality of test patterns to be used for performing a scan test of the CPU (10) are stored in the internal memory (11) or the external memory (14).

The system control circuit (15) makes the overall control, such as startup, of the semiconductor device (1A). The system control circuit (15) performs various types of control, such as reset control, of the CPU (10), the internal memory (11) and the external I/F (12) through the system bus (13) or a signal line connected directly. Further, the system control circuit (15) supplies a clock to the CPU (10), the internal memory (11) and the external I/F (12) through a clock signal line connected directly (not shown).

The semiconductor device (1A) includes, as the first test control device (3), a first test control circuit (100), a pattern input circuit (101), a first result compression circuit (206), and a first expected value storage circuit (103). Further, the semiconductor device (1A) includes, as the second test control device (4), a second test control circuit (200), a pattern generation circuit (201), a second result compression circuit (207), and a second expected value storage circuit (203). Furthermore, the semiconductor device (1A) includes, as the common result determination device (5), a recursive compression circuit (208), a comparison circuit (209), and a timer (205).

[First Test Control Device (3)]

The composing elements of the first test control device (3) are as described above in the description of the overall configuration. The first test control circuit (100) is connected to the CPU (10) through the system bus (13). The first test control circuit (100) performs a scan test of the CPU (10) in response to a request from the CPU (10).

The pattern input circuit (101) is connected to the first test control circuit (100) and the system bus (13). In response to a request from the first test control circuit (100), the pattern input circuit (101) reads a plurality of test patterns from the internal memory (11) or the external memory (14) through the system bus (13). Note that, in the case where the test patterns are prestored in the external memory (14), for example, the CPU (10) may transfer them from the external memory (14) to the internal memory (11) after completion of the startup of the semiconductor device (1A). Then, the pattern input circuit (101) may read the test patterns that have been transferred to the internal memory (11).

Further, the pattern input circuit (101) is connected to the CPU (10) through a selection circuit (300). The pattern input circuit (101) supplies the plurality of read test patterns sequentially to a plurality of scan chains of the CPU (10) through the selection circuit (300).

Specifically, one test pattern is data with the same number of bits as the number of scan chains of the CPU (10). One test pattern is input to a plurality of scan chains every one shift cycle (one clock). In the case where the number of bits of the test pattern stored in the external memory (14) or the internal memory (11) is smaller than the number of scan chains of the CPU (10) (i.e., in the case where a compressed scan test is employed), the pattern input circuit (101) extends the test pattern to data with the same number of bits as the number of scan chains of the CPU (10) and inputs it to the scan chains.

The first result compression circuit (206) compresses a test result with multiple bits output from the plurality of scan chains of the CPU (10) in the space axis direction. This test result means data with multiple bits output from the plurality of scan chains per one shift cycle. Accordingly, the test result is data with multiple bits, (e.g., several tens to several hundreds bits), which is the same number of bits as the number of scan chains of the CPU (10). The first result compression circuit (206) compresses a multi-bit test result into a 1-bit code by a compression circuit in which XORs are connected in a tree structure, for example. The first test control device (3) assumes the use of a compressed scan test technique. The first result compression circuit (206) is connected to the recursive compression circuit (208) through a selection circuit (301). The first result compression circuit (206) outputs the compressed test result (the code described above) to the recursive compression circuit (208) through the selection circuit (301).

The first expected value storage circuit (103) stores a first expected value, which is an expected value of the code after compressing the test result output from the first result compression circuit (206) by the recursive compression circuit (208). The first expected value maybe prestored in the first expected value storage circuit (103) in accordance with a plurality of test patterns stored in the external memory 14 or the internal memory 11. On the other hand, the first expected value may be prestored, together with a plurality of test patterns, in the external memory 14 or the internal memory 11, and the system control circuit (15) may read the first expected value from the external memory 14 or the internal memory 11 and writes it into the first expected value storage circuit (103) after completion of the startup of the semiconductor device (1A). The first expected value storage circuit (103) is connected to the comparison circuit (209) through a selection circuit (302). The first expected value storage circuit (103) outputs the first expected value to the comparison circuit (209) through the selection circuit (302).

[Second Test Control Device (4)]

The composing elements of the second test control device (4) are as described above in the description of the overall configuration. The second test control circuit (200) is connected to the system control circuit (15). The second test control circuit (200) performs a scan test of the CPU (10) in response to a request from the system control circuit (15).

The pattern generation circuit (201) is connected to the second test control circuit (200). In response to a request from the second test control circuit (200), the pattern generation circuit (201) generates a plurality of test patterns by pseudorandom numbers. The pattern generation circuit (201) is connected to the CPU (10) through the selection circuit (300). The pattern generation circuit (201) supplies the plurality of generated test patterns sequentially to a plurality of scan chains of the CPU (10) through the selection circuit (300).

The second result compression circuit (207) compresses a multi-bit test result output from the plurality of scan chains of the CPU (10) in the time axis direction. The second result compression circuit (207) compresses all test results into one multi-bit code by MISR (Multiple Input Signature Register), for example. Specifically, this code is multi-bit data with the same number of bits as the number of a plurality of scan chains. Note that a test result that has been compressed in the spatial direction by a compression circuit in which XORs are connected in a tree structure may be an input of MISR. In other words, the number of bits of a code may be smaller than the number of scan chains. The second test control device (4) assumes the use of Logic BIST technology. The second result compression circuit (207) is connected to the recursive compression circuit (208) through the selection circuit (301). The second result compression circuit (207) outputs the compressed test result (the code described above) to the recursive compression circuit (208) through the selection circuit (301).

The second expected value storage circuit (203) stores a second expected value, which is an expected value of the code after compressing the test result output from the second result compression circuit (207) by the recursive compression circuit (208). The second expected value is generated by the pattern generation circuit (201) in accordance with the test patterns generated by the pattern generation circuit (201) and stored into the second expected value storage circuit (203). The second expected value storage circuit (203) is connected to the comparison circuit (209) through the selection circuit (302). The second expected value storage circuit (203) outputs the second expected value to the comparison circuit (209) through the selection circuit (302).

It should be noted that the storage circuit included in the semiconductor device (1A), such as the first expected value storage circuit (103) and the second expected value storage circuit (203), are a circuit, a register, a memory or the like that indicates a predetermined value in a fixed manner by use of a power supply and a ground, for example. The memory is RAM, ROM (including a fuse ROM, for example), FLASH memory and like. The same applies to the following description.

[Common Reslut Determination Device (5)]

The composing elements of the common result determination device (5) are as described above in the description of the overall configuration. The recursive compression circuit (208) compresses the compressed test result in the time axis direction. The recursive compression circuit (208) is composed of a multi-bit register that calculates XOR of input data and data stored in itself, using the data stored in itself in a recursive manner, and stores a result of the calculation into itself, such as SISR (Single Input Signature Register), for example. The recursive compression circuit (208) is connected to the comparison circuit (209). The recursive compression circuit (208) outputs the compressed test result to the comparison circuit (209).

The comparison circuit (209) is connected to the first expected value storage circuit (103) and the second expected value storage circuit (203) through the selection circuit (302). Further, the comparison circuit (209) is connected also to the system control circuit (15). The comparison circuit (209) compares the compressed test result output from the recursive compression circuit (208) with the expected value output from the first expected value storage circuit (103) or the second expected value storage circuit (203). When the test result and the expected value do not match, the comparison circuit (209) notifies the system control circuit (15) of error. On the other hand, when the test result and the expected value match, the comparison circuit (209) notifies the system control circuit (15) of normal.

The timer (205) is a circuit that monitors a scan test execution time of each of the first test control circuit (100) and the second test control circuit (200). In other words, the timer (205) is a so-called watchdog timer. When the timer (205) is not notified of the end of a scan test by the first test control circuit (100) or the second test control circuit (200) until a predetermined time elapses from the time when the initiation of a scan test is notified from the first test control circuit (100) or the second test control circuit (200), the timer (205) notifies the system control circuit (15) of error. It is thereby possible to detect abnormality that a scan test by the first test control circuit (100) and the second test control circuit (200) does not end normally. On the other hand, when the timer (205) is notified of the end of a scan test by the first test control circuit (100) or the second test control circuit (200) until a predetermined time elapses from the time when the initiation of a scan test is notified from the first test control circuit (100) or the second test control circuit (200), the timer (205) does not notify the system control circuit (15) of error.

The selection circuit (300) selectively outputs the test pattern that is output from one of the pattern input circuit (101) and the pattern generation circuit (201) to the CPU (10). The selection circuit (301) outputs the test result that is output from one of the first result compression circuit (206) and the second result compression circuit (207) to the recursive compression circuit (208). The selection circuit (302) outputs the expected value result that is output from one of the first expected value storage circuit (103) and the second expected value storage circuit (203) to the comparison circuit (209).

Figure 3:
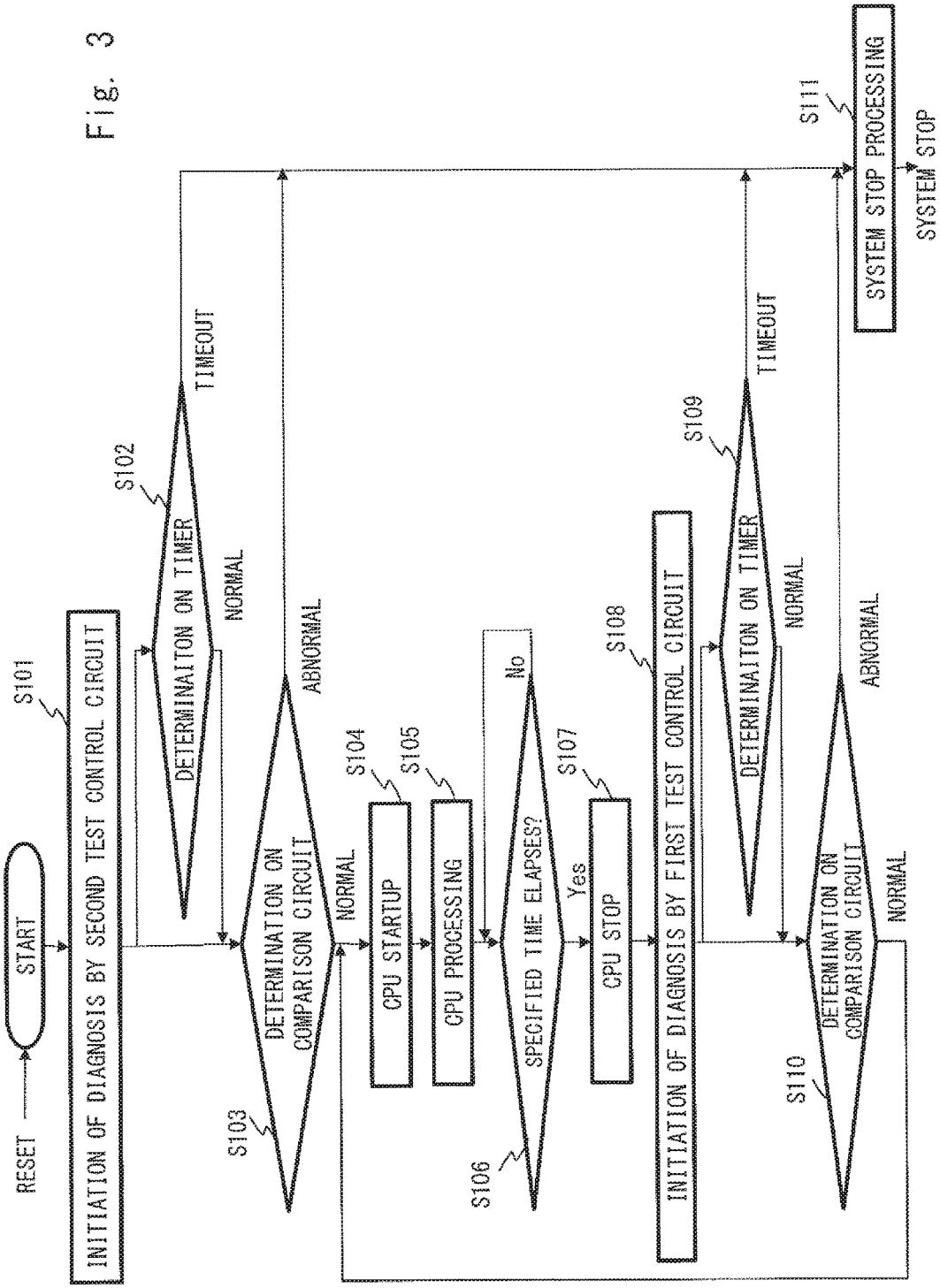
FIG. 3 is a block diagram showing the operation of the semiconductor device according to the first embodiment.

The operation during self-diagnosis of the semiconductor device (1A) according to the first embodiment is described hereinafter with reference to FIG. 3. FIG. 3 is a flowchart showing the operation during self-diagnosis of the semiconductor device (1A) according to the first embodiment.

In FIG. 3, operational events (processing blocks) are connected by arrows, and the operational events are performed in chronological order according to the orientation of arrows. A branching arrow indicates parallel execution of processing. Note that a rhombus-shaped operational event represents conditional branching. In a rhombus-shaped operational event, a downward-facing arrow basically indicates a branch destination when normal determination is made for a condition of the operational event, and a lateral-facing arrow basically indicates a branch destination when abnormal determination is made for a condition of the operational event. Hereinafter, the operation of the semiconductor device (1A) according to the first embodiment is described with reference to the example of the semiconductor device (1A) shown in FIG. 2 and the operation flow shown in FIG. 3.

[Overall Operation Flow]

When the semiconductor device (1A) is powered on and the reset of the second test control device (4) and the common result determination device (5) is cancelled, the semiconductor device (1A) makes a diagnosis for detecting LF first. This diagnosis is hereinafter referred to also as "diagnosis at startup". For the diagnosis at startup, the second test control device (4) and the common result determination device (5) are used. When LF is not detected, the semiconductor device (1A) starts the normal operation.

Further, during the normal operation, the semiconductor device (1A) suspends the processing and makes a diagnosis for detecting SPF at regular intervals. This diagnosis is hereinafter referred to also as "diagnosis during operation". For the diagnosis during operation, the first test control device (3) and the common result determination device (5) are used. When SPF is not detected, the semiconductor device (1A) resumes the normal operation. When LF or SPF is detected by the diagnosis at startup or the diagnosis during operation, the common result determination device (5) notifies the system control circuit (15) of error.

[Diagnosis at Startup (LF Detection Flow)]

When the diagnosis at startup is initiated, the system control circuit (15) asserts a diagnosis initiation signal that gives an instruction to initiate a diagnosis of the CPU (10) and outputs it to the second test control circuit (200). In response to assertion of the diagnosis initiation signal, the second test control circuit (200) initiates a diagnosis of the CPU (10) (S101). Further, when initiating a diagnosis, the second test control circuit (200) controls the selection circuit (300, 301, 302) to select the second test control device (4) side (which is "2" in FIG. 2). Note that this control of the selection circuit (300, 301, 302) maybe carried out before the system control circuit (15) asserts the diagnosis initiation signal.

Furthermore, when initiating a diagnosis, the second test control circuit (200) outputs, to the timer (205), an initiation notification signal that notifies the initiation of a scan test to be performed on the CPU (10). In response to the initiation notification signal from the second test control circuit (200), the timer (205) initiates the measurement of an elapsed time from the time when the initiation notification signal is notified (S102). The timer (205) operates in parallel with a scan test that is performed by the second test control circuit (200). When the scan test is not completed (that is, when a termination notification signal that notifies the termination of the scan test is not output from the second test control circuit (200)) until the measured elapsed time reaches a predetermined threshold, the timer (205) outputs a notification signal that notifies error (timeout) to the system control circuit (15) (S102: Timeout). Note that the output of the termination notification signal to the timer (205) may be performed when the system control circuit (15) receives a notification signal from the comparison circuit (209), which is described later.

Note that, for example, a threshold is prestored in a storage circuit (not shown) included in the semiconductor device (1A), and the timer (205) refers to the threshold that is stored in this storage circuit. Although an example in which the second test control circuit (200) controls the timer (205) is described above, the system control circuit (15) may directly control the timer (205).

To initiate a diagnosis of the CPU (10), the second test control circuit (200) outputs an instruction signal for generating test patterns to the pattern generation circuit (201). In response to the instruction signal from the second test control circuit (200), the pattern generation circuit (201) generates test patterns. For the generation of test patterns, PRPG (Pseudo Random Pattern Generator) using LFSR (Linear Feedback Shift Register) is used, for example. Specifically, in this case, the second test control circuit (200) includes a PRPG.

Test patterns are generated in this manner because, during the startup of the semiconductor device (1A), many modules including the system bus (13) in the semiconductor device (1A) are in the resting state for diagnosis, and it is not possible to read test patterns from the internal memory (11) or the external memory (14) through the system bus (13). Therefore, a method that stores test patterns in a storage circuit can be implemented in only a limited way, such as preparing a dedicated storage circuit (e.g., FLASH memory, ROM etc.) that can be accessed without through the system bus (13).

On the other hand, in the diagnosis by the second test control device (4) and the common result determination device (5) during the startup of the semiconductor device (1A), test patterns are generated using pseudorandom numbers, which eliminates the need to add a dedicated storage circuit to the semiconductor device (1A) and reduces the area cost of the semiconductor device (1A).

The need to add a dedicated storage circuit is eliminated by reading test patterns from the internal memory (11) or the external memory (14) through the system bus (13) after the diagnosis of the system bus (13) is completed. However, in this method, the diagnosis at startup of the CPU (10) cannot be initiated until the diagnosis of the system bus (13) is completed. This is not preferable because a time to complete startup is often limited (e.g., in 50 msec) for the semiconductor device. On the other hand, by generating test patterns by using pseudorandom numbers as described above, it is possible to perform the diagnosis at startup of the CPU (10) in parallel with the diagnosis of the system bus (13), and it is thereby possible to reduce the starting of the semiconductor device (1A) and complete the startup of the semiconductor device (1A) within the time limit.

The pattern generation circuit (201) supplies the plurality of generated test patterns sequentially to the scan chains of the CPU (10) and executes a scan test of the CPU (10). Specifically, the CPU (10) performs an operation (capture) with the test patterns supplied to the scan chains. As a result of this operation, test results stored in the scan chains are serially acquired by the second result compression circuit (207), and all test results are compressed into one code.

After all the test patterns that are necessary as the diagnosis at startup of the CPU (10) are supplied, and all the test results are compressed by the second result compression circuit (207), the second result compression circuit (207) outputs the plurality of test results (codes) serially one bit by one bit to the recursive compression circuit (208). The recursive compression circuit (208) recompresses the compressed test results output from the second result compression circuit (207). Consequently, in the case where the recursive compression circuit (208) includes SISR, the test result (the size of which is the number of bits of the multi-bit test result after compression by the second result compression circuit (207) ×1) is compressed to the size corresponding to the number of stages of the SISR. The recursive compression circuit (208) outputs the compressed test result to the comparison circuit (209).

The comparison circuit (209) determines whether the compressed test result that is output from the recursive compression circuit (208) and the second expected value that is stored in the second expected value storage circuit (203) match or not (S103).

When the comparison result is a match, the comparison circuit (209) determines that the CPU (10) is normal (S103: Normal). In this case, the comparison circuit (209) outputs a notification signal for notifying normal to the system control circuit (15).

On the other hand, when the comparison result is a mismatch, the comparison circuit (209) determines that the CPU (10) is abnormal (S103: Abnormal). In other words, LF is detected in this case. In this case, the comparison circuit (209) outputs a notification signal for notifying error to the system control circuit (15).

When a notification signal for notifying error is output from the timer (205) or the comparison circuit (209), the system control circuit (15) promptly performs processing to stop the system in the semiconductor device (1A) and thereby stops the system in the semiconductor device (1A) (S111). In other words, the system control circuit (15) inhibits the starting of the semiconductor device (1A).

Further, when the scan test ends, the second test control circuit (200) outputs a termination notification signal that notifies the termination of a scan test to the timer (205).

[Diagnosis During Operation (SPF Detection Flow)]

When the LF diagnosis result of the CPU (10) is normal (S103: Normal), the system control circuit (15) initiates the startup of the CPU (10) (S104). After the startup is completed, the CPU (10) performs the processing of the application program (S105). Further, in the processing of the application program, the CPU (10) also performs processing to make a self-diagnosis on a regular basis (each time a specified time elapses). When a specified time elapses and it reaches the time to perform processing for a self-diagnosis (S106: Yes), the CPU (10) asserts a diagnosis initiation signal that gives an instruction to initiate a diagnosis of the CPU (10) and outputs it to the first test control circuit (100) through the system bus (13), and then transitions to the state where the processing is stopped (e.g., the sleep mode) (S107).

In response to assertion of the diagnosis initiation signal, the first test control circuit (100) initiates a diagnosis of the CPU (10) (S108). Further, the first test control circuit (100) controls the selection circuit (300, 301, 302) to select the first test control device (3) side (which is "1" in FIG. 2). Note that this control of the selection circuit (300, 301, 302) maybe carried out before the CPU (10) asserts the diagnosis initiation signal.

Furthermore, when initiating a diagnosis, the first test control circuit (100) outputs, to the timer (205), an initiation notification signal that notifies the initiation of a scan test to be performed on the CPU (10). In response to the initiation notification signal from the first test control circuit (100), the timer (205) initiates the measurement of an elapsed time from the time when the initiation notification signal is notified (S109). The timer (205) operates in parallel with a scan test that is performed by the first test control circuit (100). When the scan test is not completed (that is, when a termination notification signal that notifies the termination of the scan test is not output from the first test control circuit (100)) until the measured elapsed time reaches a predetermined threshold, the timer (205) notifies the system control circuit (15) of error (timeout) (S109: Timeout). Note that the output of the termination notification signal to the timer (205) may be performed when the system control circuit (15) receives a notification signal from the comparison circuit (209), which is described later.

Note that, for example, the timer (205) refers to a threshold that is stored in a storage circuit included in the semiconductor device (1A) as described above. Further, a threshold that is used in the diagnosis during operation and a threshold that is used in the diagnosis at startup may be different.

To initiate a diagnosis of the CPU (10), the first test control circuit (100) outputs an instruction signal for inputting test patterns to the pattern input circuit (101) through the system bus (13). In response to the instruction signal from the first test control circuit (100), the pattern input circuit (101) acquires test patterns from the internal memory (11) or the external memory (14).

This is to use test patterns consisting of arbitrary values in order to achieve a high fault detection rate in a short test time. Due to the use of arbitrary values, the amount of data is likely to be large. However, the area cost of the semiconductor device (1A) can be reduced when test patterns are stored in the external memory (14).

The pattern input circuit (101) supplies the plurality of acquired test patterns to the scan chains of the CPU (10) and executes a scan test of the CPU (10). Specifically, the CPU (10) performs an operation (capture) with the test patterns supplied to the scan chains. As a result of this operation, test results stored in the scan chains are serially acquired by the first result compression circuit (206) and compressed into 1-bit code. The first result compression circuit (206) outputs the compressed test results (codes) serially one bit by one bit to the recursive compression circuit (208). The recursive compression circuit (208) recompresses the compressed test results (codes) output from the first result compression circuit (206). Consequently, in the case where the recursive compression circuit (208) includes SISR, the test result (the size of which is 1-bit test result after compression by the first result compression circuit (206)×its number) is compressed to the size corresponding to the number of stages of SISR. The recursive compression circuit (208) outputs the compressed test result to the comparison circuit (209).

The comparison circuit (209) determines whether the compressed test result that is output from the recursive compression circuit (208) and the first expected value that is stored in the first expected value storage circuit (103) match or not (S110).

When the comparison result is a match, the comparison circuit (209) outputs a notification signal for notifying normal to the system control circuit (15). When the notification signal that notifies normal is output from the comparison circuit (209), the system control circuit (15) determines that the CPU (10) is normal (S110: Normal).

When the CPU (10) is determined to be normal (S110: Normal), the system control circuit (15) resets and restarts the CPU (10) (S104). After the restart is completed, the CPU (10) resumes the processing that has been stopped in the above-described Step S107 (S105). Then, after a specified time elapses (S106: Yes), the CPU (10) performs processing to make a self-diagnosis again (S107).

On the other hand, when the comparison result is a mismatch, the comparison circuit (209) outputs a notification signal for notifying error to the system control circuit (15). When the notification signal that notifies error is output from the comparison circuit (209), the system control circuit (15) determines that the CPU (10) is abnormal (S110: Abnormal). In other words, SPF is detected in this case.

When the CPU (10) is determined to be abnormal (S110: Abnormal), the system control circuit (15) rapidly performs processing to stop the system in the semiconductor device (1A) and thereby stops the system in the semiconductor device (1A) (S111).

[Supplementary Explanation of SPF/LF Detection in Terms of Functional Safety]

The reasons why both SPF and LF can be detected and the functional safety is valid in the configuration and operation of the first embodiment are described hereinafter.

SPF is a failure due to a single fault and, in the first embodiment, it corresponds to a failure that occurs due to a fault in the CPU (10). A fault in the CPU (10) is detected by a scan test that is performed by the first test control device (3) at regular intervals and a result determination that is made by the common result determination device (5), and it can be concluded that the safety (reliability) against SPF of the semiconductor device (1A) is improved according to the first embodiment.

LF is a failure due to the simultaneous occurrence of multiple faults. For example, it is a failure that SPF that should be detected by a safety mechanism becomes undetectable due to a fault occurring in the safety mechanism. In the first embodiment, it corresponds to a failure that occurs due to a fault in the CPU (10) and the common result determination device (5). To be more specific, while the CPU (10) is a module that initiates the operation to detect SPF (i.e. diagnosis during operation), if a fault occurs in a mechanism to start up the diagnosis during operation of the CPU (10) and the diagnosis during operation cannot be started, a failure in the CPU (10) that occurs at the same time is missed. As a result, the improvement of safety is hindered. As for the common result determination device (5), if a fault that always notifies the system control circuit (15) of that the CPU (10) is normal regardless of a comparison result between a test result and an expected value occurs in the common result determination device (5), a fault in the CPU (10) that should be detected by the diagnosis during operation is not notified to the system control circuit (15), and therefore the improvement of safety is hindered.

A fault in the CPU (10) is detected by a scan test that is performed by the second test control device (4) and the common result determination device (5) at the startup of the semiconductor device (1A). A fault in the common result determination device (5) is functionally diagnosed by the operation for detecting LF (i.e., diagnosis at startup). This is because the recursive compression circuit (208) included in the common result determination device (5) has a multi-bit register that calculates XOR of input data and its own data and uses its own value in a recursive manner, which is a structure in which 1-bit inversion significantly changes a result. Therefore, in addition to a test result that is output from the second test control device (4), if the recursive compression circuit (208) performs an operation that is different from an expected one, it becomes apparent since a test result is a different value from an expected value. Note that an incorrect determination of the comparison circuit (209) can be dealt with by adding a diagnosis of the comparison circuit (209), which is described later, in the diagnosis at startup.

Note that, as for the first test control device (3), the improvement of safety is not hindered even when a fault occurs in any part. For example, even when a fault occurs simultaneously in the pattern input circuit (101) and the CPU (10), the fault becomes apparent as a mismatch between a final test result generated by the recursive compression circuit (208) and an expected value. As a result, the system control circuit (15) is notified of error and can perform control to transition the system to safety mode. Thus, as long as the diagnosis during operation by the CPU (10) is performed normally and an evaluation by the common result determination device (5) is correct, the improvement of safety is not hindered regardless of the operation during the diagnosis.

For the above reasons, according to the first embodiment, it can be concluded that the safety of the semiconductor device (1A) against LF is improved. Thus, according to the first embodiment, it is possible to detect both of SPF and LF and enhance the reliability of the semiconductor device (1A).

Further, in the first embodiment, the common result determination device (5) that includes the recursive compression circuit (208) and the comparison circuit (209) is shared by the first test control device (3) for detecting SPF in the CPU (10) and the second test control device (4) for detecting LF in the CPU (10). In this configuration, LF in the recursive compression circuit (208) and the comparison circuit (209) is detected by performing the diagnosis at startup, and it is not necessary to add a diagnosis device for detecting LF to "a diagnosis device for detecting SPF in the CPU (10)".

Further, in the first embodiment, the first test control device (3) using a scan test (compressed scan) is used for detecting SPF, and the second test control device (4) using a scan test (Logic BIST) is used for detecting LF.

In this configuration, it is possible to implement a semiconductor device with high safety capable of detecting both of SPF and LF at low cost. To be specific, a scan test of the CPU (10) is performed by the first test control device (3) during the diagnosis during operation of the CPU (10), and SPF can be thereby detected without making the CPU (10) redundant, and it is thereby possible to reduce the area and power consumption for the redundancy of the CPU (10) and achieve cost reduction. Further, a scan test of the CPU (10) is performed by the second test control device (4) during the diagnosis at startup of the CPU (10), and a determination using its result is made by the recursive compression circuit (208) and the comparison circuit (209), which are used also for detection of SPF, and thereby LF in the CPU (10) can be detected by the scan test, and LF in the recursive compression circuit (208) and the comparison circuit (209) can be also detected, and it is thus possible to enhance the safety.

Note that, although an example in which a circuit to be tested (circuit to be diagnosed) is a CPU is described in the first embodiment, a circuit to be tested is not limited to a CPU. It may be applied to various processing modules in a semiconductor device where high safety is required.

<Modified Example of First Embodiment>

Figure 4:
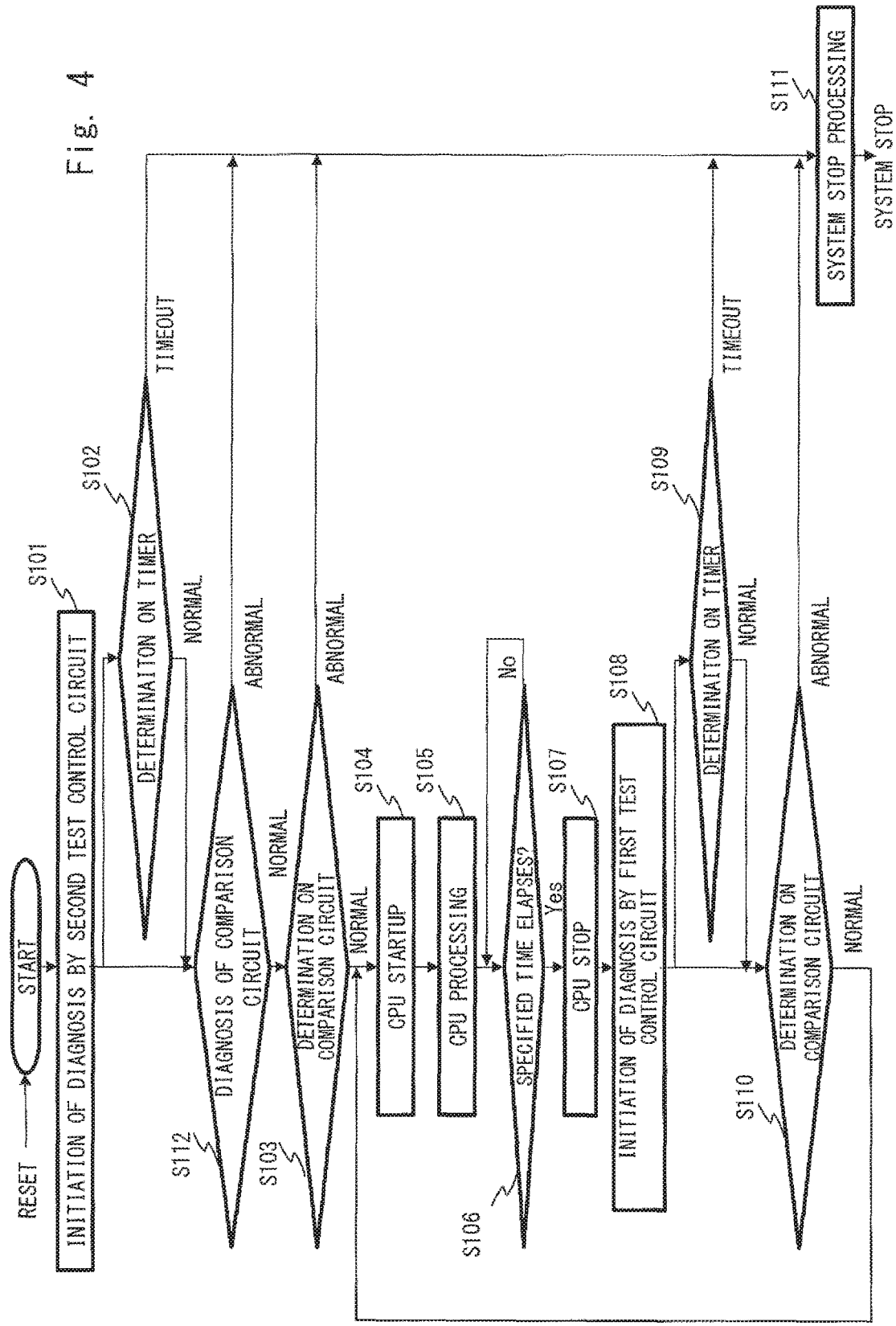
FIG. 4 is a block diagram showing the configuration of a semiconductor device according to a modified example of the first embodiment.

A modified example of the first embodiment is described next. The operation during self-diagnosis of the semiconductor device (1A) according to the modified example of the first embodiment is described hereinafter with reference to FIG. 4. FIG. 4 is a flowchart showing the operation during self-diagnosis of the semiconductor device (1A) according to the modified example of the first embodiment. In the operation shown in FIG. 3, an operation that diagnoses whether the comparison circuit (209) is failed or not may be added in the diagnosis at startup. This operation is illustrated in FIG. 4. The operation shown in FIG. 4 is different from the operation shown in FIG. 3 in that Step S112 is added between Step S101, S102 and Step S103.

Before the system control circuit (15) gives an instruction to initiate a diagnosis of the CPU (10), it asserts a diagnosis initiation signal that gives an instruction to initiate a diagnosis of the comparison circuit (209) and outputs it to the second test control circuit (200). In response to assertion of the diagnosis initiation signal, the second test control circuit (200) initiates a diagnosis of the comparison circuit (209) (S112).

Although a scan test of the CPU (10) is performed in Step S112 in the same manner as in Step S103, it is different in that the second expected value stored by the second test control circuit (200) into the second expected value storage circuit (203) is a value that intentionally causes an error.

Thus, in Step S112, when a notification signal that notifies error is output from the comparison circuit (209), the system control circuit (15) determines that the comparison circuit (209) is normal (S112: Normal). In this case, the operation of the semiconductor device (1A) proceeds to Step S103.

On the other hand, when a notification signal that notifies normal is output from the comparison circuit (209), the system control circuit (15) determines that the CPU (10) is abnormal (S112: Abnormal). In this case, the system control circuit (15) promptly performs processing to stop the system in the semiconductor device (1A) and thereby stops the system in the semiconductor device (1A) (S111). In other words, the system control circuit (15) inhibits the starting of the semiconductor device (1A).

Note that a diagnosis of the comparison circuit (209) is not limited to perform a scan test in the above-described manner. For example, the system control circuit (15) may store a second expected value, which is different from an initial value that is output from the recursive compression circuit (208) to the comparison circuit (209), into the second expected value storage circuit (203) at the startup of the semiconductor device (1A), and causes the comparison circuit (209) to make only a comparison of the initial value that is output from the comparison circuit (209) with the second expected value that is stored in the second expected value storage circuit (203) and a notification in accordance with the comparison result, thereby diagnosing the comparison circuit (209).

As described above, in the modified example of the first embodiment, the comparison circuit (209) makes a comparison between different values before conducting a scan test, and if a comparison result is a match, the operation of the semiconductor device (1A) is stopped. It is thereby possible to detect a fault in the comparison circuit (209) and prevent the failed comparison circuit (209) from making a determination about a test result.

<Second Embodiment>

Figure 5:
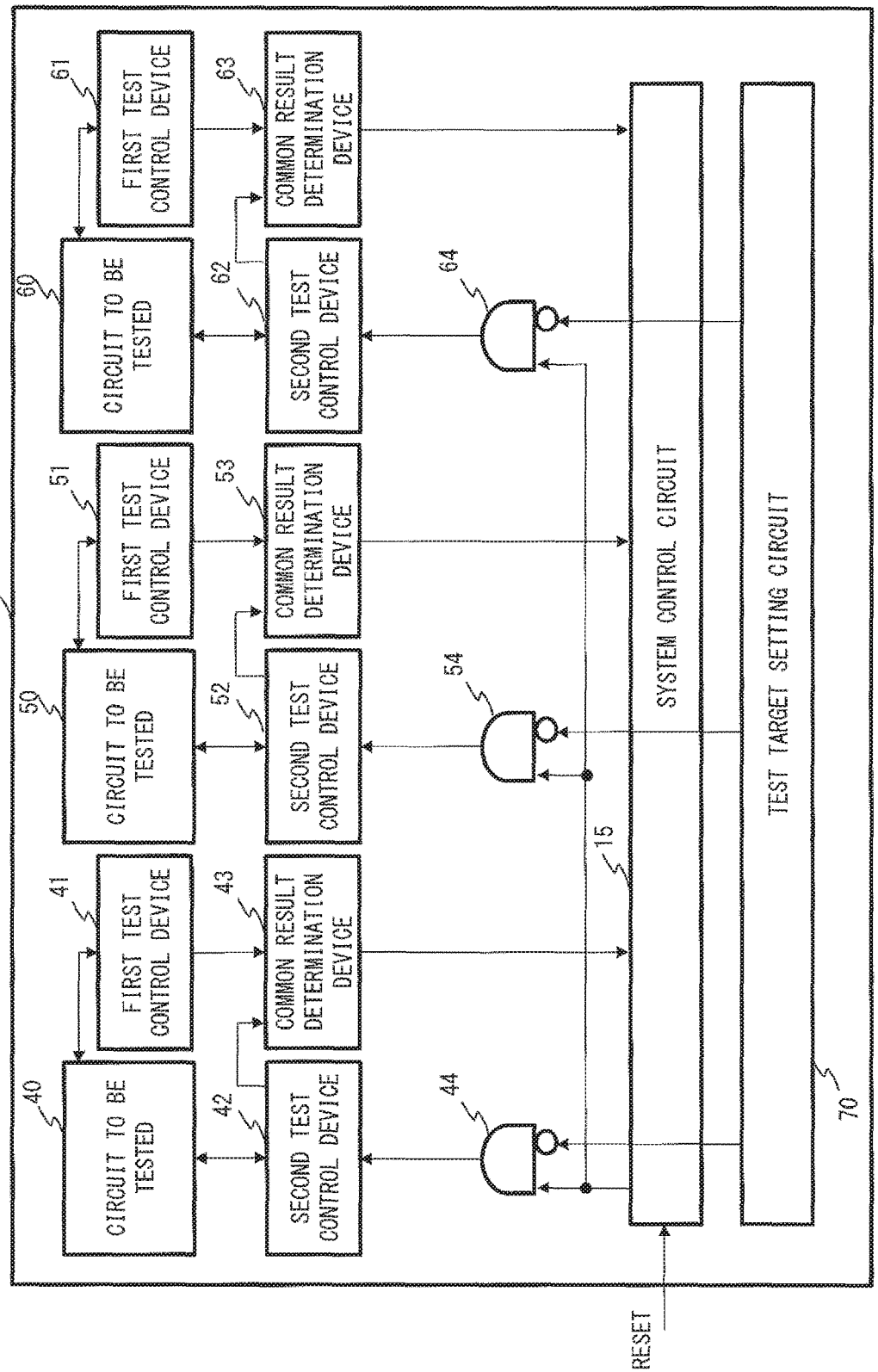
FIG. 5 is a block diagram showing the configuration of a semiconductor device according to a second embodiment.

A second embodiment is described hereinbelow. In the following description of the second embodiment, the same elements as in the first embodiment described above are denoted by the same reference symbols or the like, and the description of the same is omitted as appropriate. The configuration of a semiconductor device (1B) according to the second embodiment is described hereinafter with reference to FIG. 5. FIG. 5 is a block diagram showing the configuration of the semiconductor device (1B) according to the second embodiment.

As shown in FIG. 5, the semiconductor device (1B) includes, as element for implementing its functions, a plurality of circuits to be tested (40, 50, 60) and a system control circuit (15). Although an example in which the number of circuits to be tested is three is shown in FIG. 5, the number of circuits to be tested is not limited thereto.

Each of the circuits to be tested (40, 50, 60) is the same as the circuit to be tested (2). Accordingly, each of the circuits to be tested (40, 50, 60) is the CPU (10), for example.

Further, the semiconductor device (1B) includes a plurality of first test control devices (41, 51, 61), a plurality of second test control devices (42, 52, 62), and a plurality of common result determination devices (43, 53, 63).

Each of the first test control devices (41, 51, 61) is the same as the first test control device (3). Thus, each of the first test control devices (41, 51, 61) includes the first test control circuit (100), the pattern input circuit (101), the first result compression circuit (206) and the first expected value storage circuit (103) (not shown).

Each of the second test control devices (42, 52, 62) is the same as the second test control device (4). Thus, each of the second test control devices (42, 52, 62) includes the second test control circuit (200), the pattern generation circuit (201), the second result compression circuit (207) and the second expected value storage circuit (203) (not shown).

Each of the common result determination devices (43, 53, 63) is the same as the common result determination device (5). Thus, each of the common result determination devices (43, 53, 63) includes the recursive compression circuit (208), the comparison circuit (209) and the timer (205).

Thus, the first test control devices (41, 51, 61) and the common result determination devices (43, 52, 62) correspond to devices that perform the diagnosis during operation of the circuits to be tested (40, 50, 60), respectively. The second test control devices (42, 52, 62) and the common result determination devices (43, 53, 63) correspond to devices that perform the diagnosis at startup of the circuits to be tested (40, 50, 60), respectively.

Further, the semiconductor device (1B) includes AND gates (44, 54, 64) and a test target setting circuit (70).

The AND gate (44) is inserted into a signal line through which a diagnosis initiation signal is transmitted from the system control circuit (15) to the second test control device (42). The AND gate (54) is inserted into a signal line through which a diagnosis initiation signal is transmitted from the system control circuit (15) to the second test control device (52). The AND gate (64) is inserted into a signal line through which a diagnosis initiation signal is transmitted from the system control circuit (15) to the second test control device (62).

To the AND gate (44), a diagnosis initiation signal that is output from the system control circuit (15) and a reversal value of a test target setting signal that is output from the test target setting circuit (70) are input. To the AND gate (54), a diagnosis initiation signal that is output from the system control circuit (15) and a reversal value of a test target setting signal that is output from the test target setting circuit (70) are input. To the AND gate (64), a diagnosis initiation signal that is output from the system control circuit (15) and a reversal value of a test target setting signal that is output from the test target setting circuit (70) are input.

Each of the AND gates (44, 54, 64) calculates AND of the reversal value of the test target setting signal that is output from the test target setting circuit (70) and the diagnosis initiation signal that is output from the system control circuit (15), and outputs a signal indicating the calculation result to the second test control device (42).

A storage circuit (not shown) included in the test target setting circuit (70) stores, for each of the circuits to be tested (40, 50, 60), a value indicating whether it is a target of the diagnosis at startup to be made at the startup of the semiconductor device (1B). This storage circuit is a memory whose value can be changed arbitrarily in a step after completion of manufacture of the semiconductor device (1B), for example. This memory is FLASH memory, fuse ROM or the like, for example. The test target setting circuit (70) outputs values for the circuits to be tested (40, 50, 60) to the AND gates (44, 54, 64), respectively, as test target setting signals. To be more specific, when it is a target of the diagnosis at startup to be made at the startup of the semiconductor device (1B), a Low level test target setting signal is output, and when it is not a target of the diagnosis at startup to be made at the startup of the semiconductor device (1B), a High level test target setting signal is output.

When the test target setting signal that is output from the test target setting circuit (70) is Low level, the AND gate (44) outputs the diagnosis initiation signal that is output from the system control circuit (15) to the second test control device (42) without making any changes. Thus, the High level diagnosis initiation signal (the asserted diagnosis initiation signal) that is output from the system control circuit (15) can be directly output to the second test control device (42). The diagnosis at startup by the second test control device (42) can be thereby initiated by the system control circuit (15).

On the other hand, when the test target setting signal that is output from the test target setting circuit (70) is High level, the AND gate (44) always outputs a Low level signal (negated signal), regardless of the value of the diagnosis initiation signal that is output from the system control circuit (15), as the diagnosis initiation signal to the second test control device (42). Thus, the diagnosis at startup by the second test control device (42) cannot be initiated by the system control circuit (15).

The operation of the AND gates (54, 64) is the same as the above-described operation, and the description thereof is omitted.

As described above, in the second embodiment, values indicating whether each of the circuits to be tested (40, 50, 60) is a target of a scan test by the plurality of second test control devices (42, 52, 62) at the startup of the semiconductor device (1B) are stored in the test target setting circuit (70). According to those values, each of the plurality of second test control devices (42, 52, 62) performs a scan test at the startup of the semiconductor device (1B). It is thereby possible to disable the diagnosis at startup of an arbitrary circuit to be tested and reduce the target of the diagnosis at startup. Specifically, by not performing the diagnosis at startup of an arbitrary circuit to be tested, it is possible to reduce the starting time of the semiconductor device (1B). This setting can be changed before shipping out a semiconductor product, it is possible to deal with a plurality of customer needs, such as when placing a priority to enhanced safety and when placing a priority to startup speed.

<Third Embodiment>

A third embodiment is described hereinbelow. In the following description of the third embodiment, the same elements as in the second embodiment described above are denoted by the same reference symbols or the like, and the explanation of the same is omitted as appropriate.

[Configuration]

Figure 6:
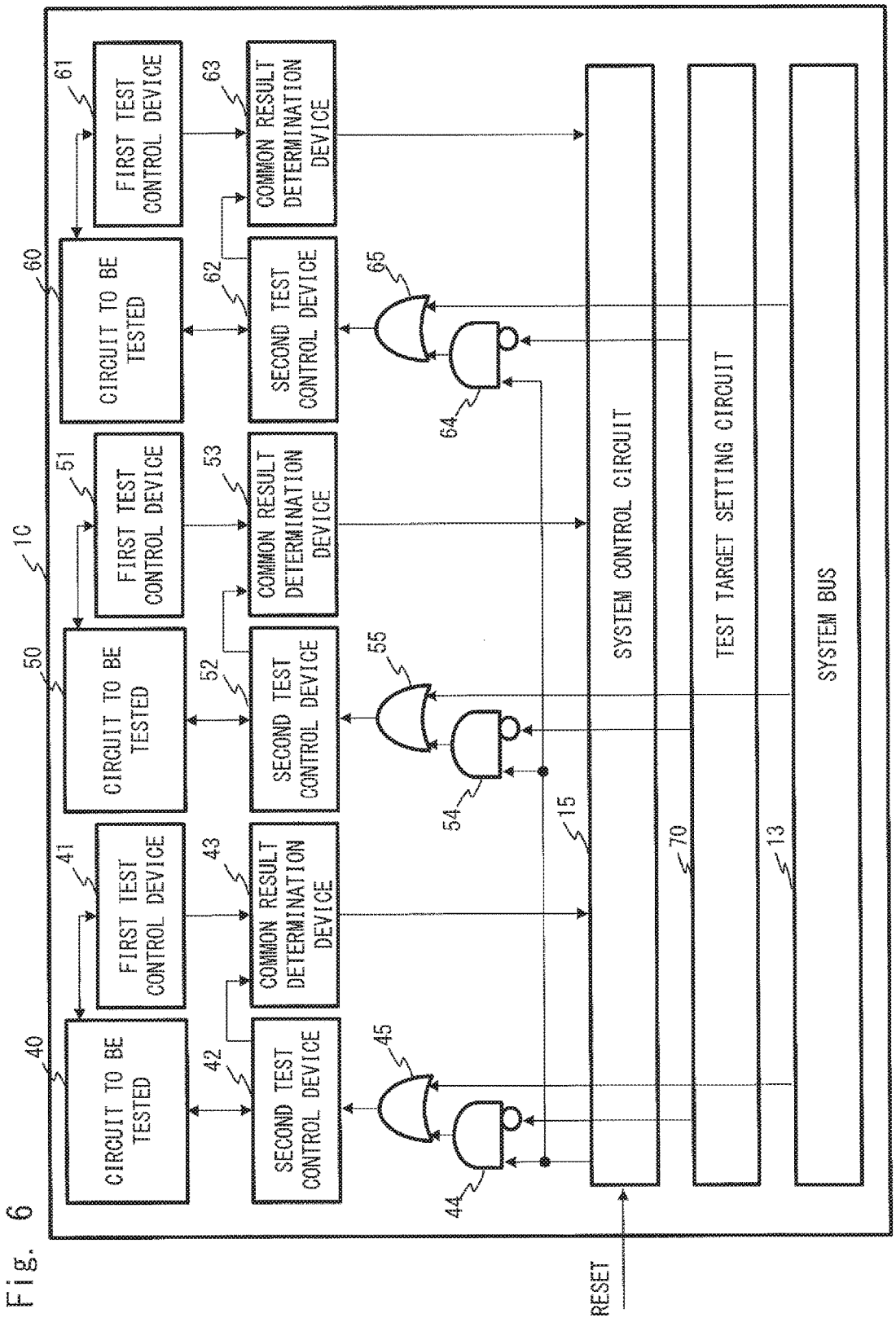
FIG. 6 is a block diagram showing the configuration of a semiconductor device according to a third embodiment.

The configuration of a semiconductor device (1C) according to the third embodiment is described hereinafter with reference to FIG. 6. FIG. 6 is a block diagram showing the configuration of the semiconductor device (1C) according to the third embodiment. As shown in FIG. 3, the semiconductor device (1C) is different from the semiconductor device (1B) according to the second embodiment in that it further includes a plurality of OR gates (45, 55, 65). Further, the system bus (13) is explicitly shown in FIG. 6.

The OR gate (45) is inserted into a signal line through which a diagnosis initiation signal is transmitted from the AND gate (44) to the second test control device (42). The OR gate (55) is inserted into a signal line through which a diagnosis initiation signal is transmitted from the AND gate (54) to the second test control device (52). The OR gate (65) is inserted into a signal line through which a diagnosis initiation signal is transmitted from the AND gate (64) to the second test control device (62).

One input terminal of each of the OR gates (45, 55, 65) is connected to the output terminal of each of the AND gates (44, 54, 64) as described above, and the other input terminal of each of the OR gates (45, 55, 65) is connected to the system bus (13).

Each of the OR gates (45, 55, 65) calculates OR of the diagnosis initiation signal that is output from each of the AND gates (44, 54, 64) and the diagnosis initiation signal that is output from the system bus (13), and outputs a signal indicating the calculation result to the second test control device (42).

[Operation]

When the diagnosis initiation signal that is output from the system bus (13) is Low level, the OR gate (45) outputs the diagnosis initiation signal that is output from the AND gate (44) to the second test control device (42) without making any changes. Specifically, when the circuit to be tested (40) is set as a test target in the test target setting circuit (70), and a test target setting signal that is output from the test target setting circuit (70) to the AND gate (44) is Low level, the diagnosis at startup by the second test control device (42) can be initiated by the system control circuit (15).

On the other hand, when the diagnosis initiation signal that is output from the system bus (13) is High level, the OR gate (45) always outputs a High level signal, regardless of the value of the diagnosis initiation signal that is output from the AND gate (44), as the diagnosis initiation signal to the second test control device (42). Specifically, when the circuit to be tested (40) is not set as a test target in the test target setting circuit (70), and even when a test target setting signal that is output from the test target setting circuit (70) to the AND gate (44) is High level, the diagnosis at startup by the second test control device (42) can be initiated when a diagnosis initiation signal that is output from the system bus (13) is asserted (changed from Low level to High level).

The operation of the OR gates (55, 65) is the same as the above-described operation, and the description thereof is omitted.

Figure 7A:
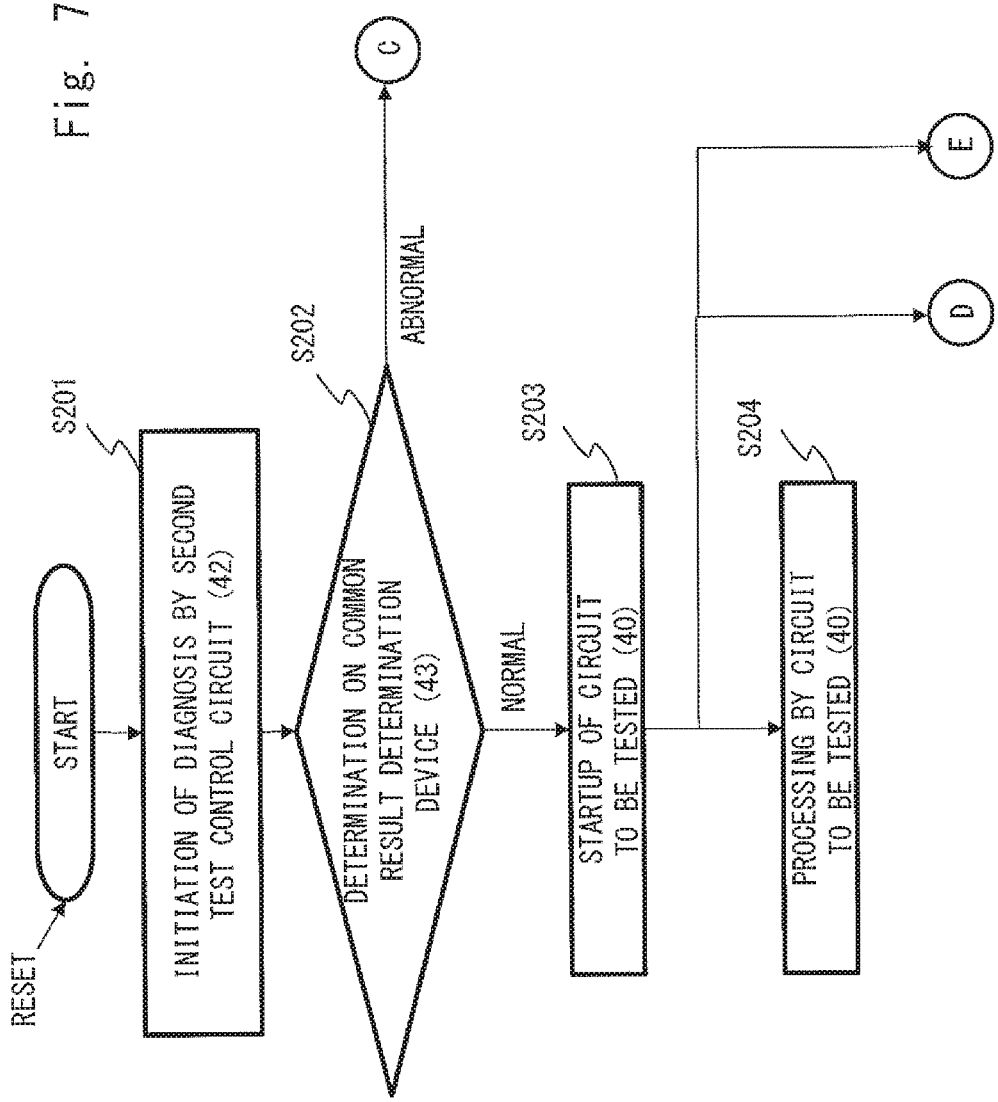
FIG. 7A, 7B are block diagrams showing the operation of the semiconductor device according to the third embodiment.
Figure 7B:
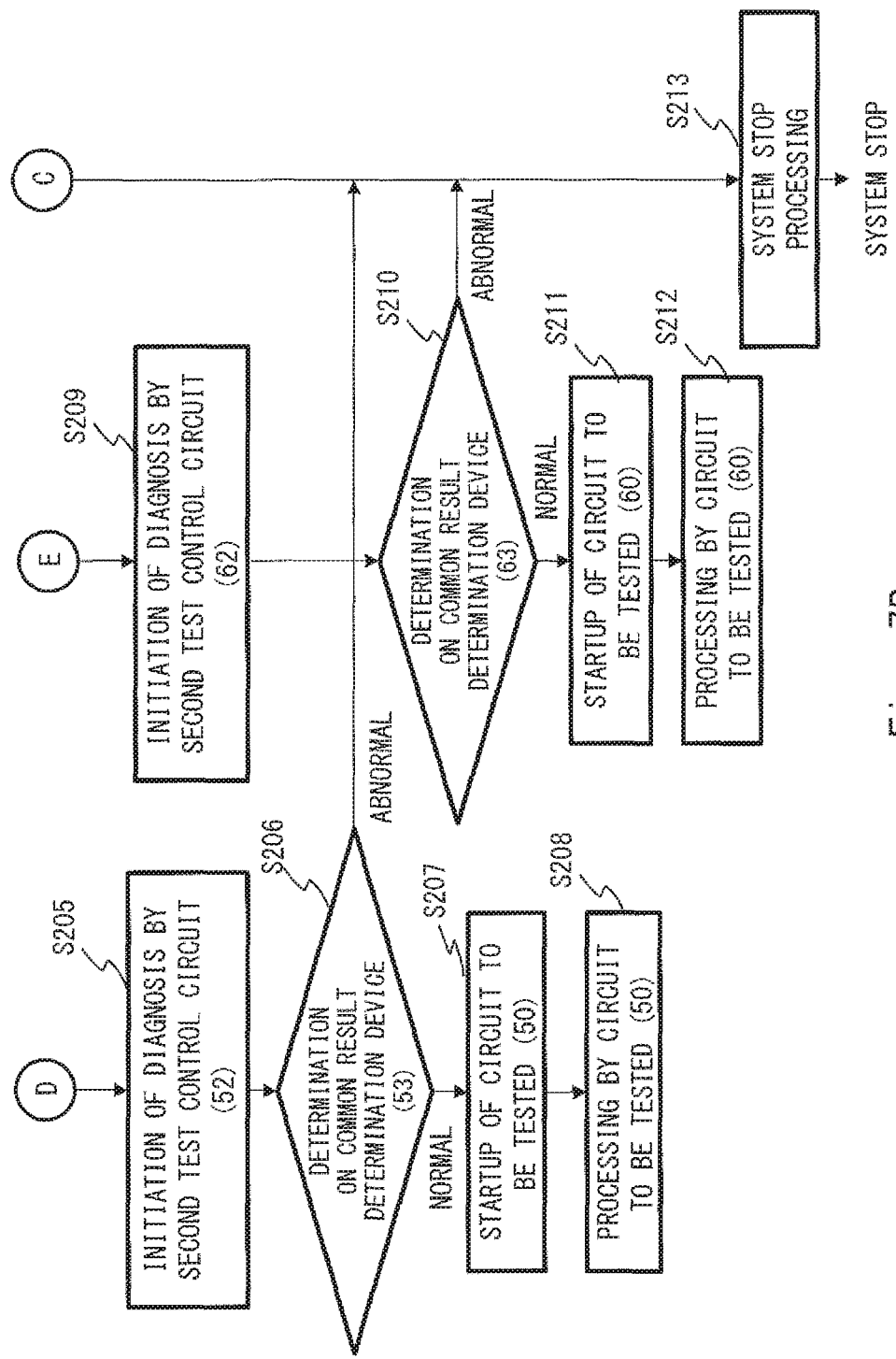

The operation during self-diagnosis of the semiconductor device (1C) according to the third embodiment is described hereinafter with reference to FIG. 7. FIG. 7 is a flowchart showing the operation during self-diagnosis of the semiconductor device (1C) according to the third embodiment.

In FIG. 7, operational events are connected by arrows, and events are performed in chronological order according to the orientation of arrows. A branching arrow indicates parallel execution of processing. Note that a rhombus-shaped event represents conditional branching. In a rhombus-shaped operational event, a downward-facing arrow basically indicates the next processing when a result is normal for the event. The operation according to the third embodiment is described with reference to the example of the semiconductor device (1C) shown in FIG. 6 and the operation flow shown in FIG. 7.

[Operation Flow]

It is assumed in this example that only the circuit to be tested (40), among the circuits to be tested (40, 50, 60), is set in the test target setting circuit (70) as a target of the diagnosis at startup to be made at the startup of the semiconductor device (1C). When the semiconductor device (1C) is powered on and the reset of the second test control devices (42, 52, 62) and the common result determination devices (43, 53, 63) is cancelled, the semiconductor device (1C) initiates the diagnosis at startup. When the diagnosis at startup is initiated, the system control circuit (15) initiates a diagnosis of the circuit to be tested (40) by the second test control device (42) (S201).

When the common result determination device (43) determines that a test result and an expected value mismatch (S202: Abnormal), it determines that the circuit to be tested (40) is abnormal and notifies the system control circuit (15) of error. Note that the same applies to the case where timeout is detected by the timer (205). On the other hand, when the common result determination device (43) determines that the circuit to be tested (40) is normal (S202: Normal), it notifies the system control circuit (15) of normal. In response to this notification, the system control circuit (15) starts the circuit to be tested (40) (S203). The circuit to be tested (40) thereby enters the normal operation mode, and initiates processing in accordance with its function (S204).

Note that specific operations in Steps 5201 and 5202 are the same as the operations in Steps 5101 to 5103 in FIG. 3, and the description thereof is omitted.

Since the circuit to be tested (40) initiates the normal operation, the system of the semiconductor device (1C) is booted (i.e., the startup of the semiconductor device (1C) is completed). After the startup of the semiconductor device (1C), the circuit to be tested (40) makes a request for initiating a diagnosis of each of the circuit to be tested (50) and circuit to be tested (60) to each of the second test control device (52) and the second test control device (62) through the system bus (13), as processing in accordance with its function. Specifically, the circuit to be tested (40) asserts a diagnosis initiation signal (changes the diagnosis initiation signal from Low level to High level) that is output to each of the OR gate (55, 65) through the system bus (13). Consequently, a diagnosis of each of the circuit to be tested (50) and circuit to be tested (60) is initiated by each of the second test control device (52) and the second test control device (62) (S205, S209).

The circuit to be tested (40) refers to a value that is stored in the test target setting circuit (70) through the system bus (13), for example, and asserts a diagnosis initiation signal for the diagnosis at startup to the second test control device (52) and the second test control device (62) respectively corresponding to the circuits to be tested (50, 60) which are, according to the value, not a target of the diagnosis at startup. Note that the circuit to be tested (40) does not necessarily perform the diagnosis at startup for all of the circuits to be tested (50, 60) which are not a target of the diagnosis at startup. The circuit to be tested (40) may perform the diagnosis at startup only for a predetermined specific circuit to be tested among the circuits to be tested (50, 60) which are not a target of the diagnosis at startup. For example, the specific circuit to be tested as a target of the diagnosis at startup may be designated by a value that is stored in the test target setting circuit (70) separately from a value indicating a target of the diagnosis at startup, and it may be set as processing of the application program executed by the circuit to be tested (40), or may be designated by a value that is stored in the external memory (14).

When the common result determination device (53) determines that a test result and an expected value mismatch (S206: Abnormal), it determines that the circuit to be tested (50) is abnormal and notifies the system control circuit (15) of error. Note that the same applies to the case where timeout is detected by the timer (205). On the other hand, when the common result determination device (53) determines that the circuit to be tested (50) is normal (S206: Normal), it notifies the system control circuit (15) of normal. In response to this notification, the system control circuit (15) starts the circuit to be tested (50) (S207). The circuit to be tested (50) thereby enters the normal operation mode, and initiates processing in accordance with its function (S208).

When the common result determination device (63) determines that a test result and an expected value mismatch (S210: Abnormal), it determines that the circuit to be tested (60) is abnormal and notifies the system control circuit (15) of error. Note that the same applies to the case where timeout is detected by the timer (205). On the other hand, when the common result determination device (63) determines that the circuit to be tested (60) is normal (S210: Normal), it notifies the system control circuit (15) of normal. In response to this notification, the system control circuit (15) starts the circuit to be tested (60) (S211). The circuit to be tested (60) thereby enters the normal operation mode, and initiates processing in accordance with its function (S212).

When an error is notified, the system control circuit (15) promptly performs processing to stop the system in the semiconductor device (1C) and thereby stops the system in the semiconductor device (1C) (S213). Note that, in the case where error is notified for at least one of the circuit to be tested (50) and the circuit to be tested (60), the system control circuit (15) may inhibit the starting of the circuit to be tested (50) or the circuit to be tested (60) for which error is notified and continue the system operation.

Note that, although each of the circuits to be tested (40, 50, 60) initiates the diagnosis at startup of itself on a regular basis in processing of the normal operation, this operation is the same as that described in the first embodiment and thus not redundantly described.

[Features and Effects]

In the third embodiment described above, there are a plurality of paths to give an instruction to initiate a diagnosis to each of a plurality of targets of the diagnosis at startup. In the third embodiment, there are two paths: a path in which a diagnosis is started by the system control circuit (15) after reset is cancelled immediately after power-on, and a path in which a diagnosis is started through the system bus (13) after the system of the semiconductor device (1C) is booted. Stated differently, the circuit to be tested (40) that is designated as a target of a scan test by the second test control circuit by a value stored in the test target setting circuit (70) gives an instruction to perform the diagnosis at startup (scan test) for the second test control devices (52, 62) corresponding to a specified circuit to be tested (all or some of circuits to be tested) among the circuits to be tested (50, 60) that are not designated as a target of a scan test by the second test control circuit by a value stored in the test target setting circuit (70). It is thereby possible to reduce the boost time of the system as well as ensuring high safety.

This is based on the consideration that, because not all of the circuits to be tested (40, 50, 60) in the semiconductor device (1C) initiate the operation just after startup, priorities can be placed on their self-diagnoses. For example, when a circuit to be tested is a communication module that communicates with an external network, the circuit needs to be started up promptly, and its self-diagnosis needs to be performed immediately after startup. On the other hand, when a circuit to be tested is a module, such as an image processing module, that is expected to operate later than a communication module, a self-diagnosis can be performed in no hurry after the starting of the semiconductor device (1C) is completed. This is because a fault that occurs before the operation is expected does not correspond to LF.

<Fourth Embodiment>

A fourth embodiment is described hereinafter. In the following description of the fourth embodiment, the same elements as in the first embodiment described above are denoted by the same reference symbols or the like, and the explanation of the same is omitted as appropriate.

[Configuration]

Figure 8:
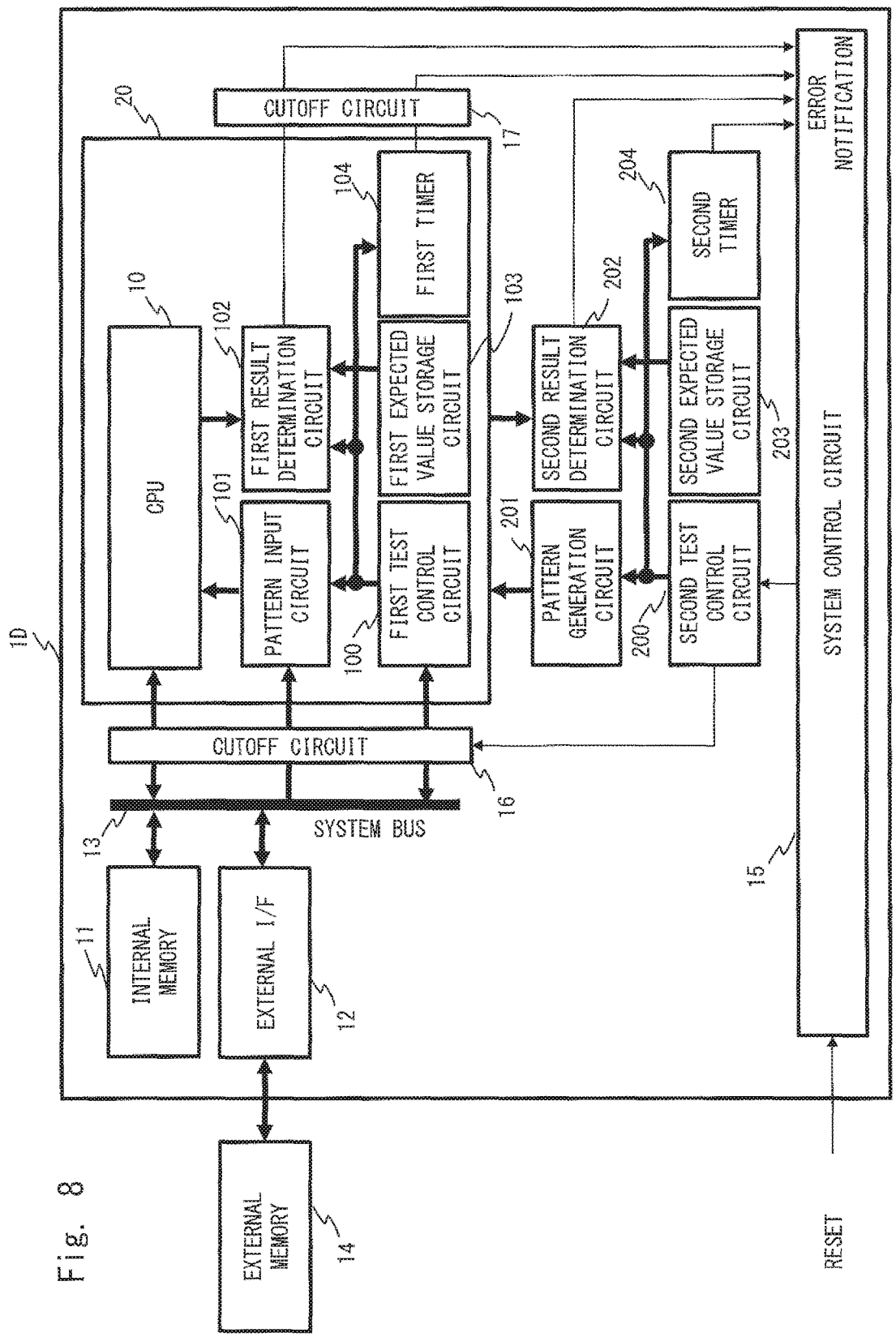
FIG. 8 is a block diagram showing the configuration of a semiconductor device according to a fourth embodiment.

The configuration of a semiconductor device (1D) according to the fourth embodiment is described hereinafter with reference to FIG. 8. FIG. 8 is a block diagram showing the configuration of the semiconductor device (1D) according to the fourth embodiment. As shown in FIG. 8, the semiconductor device (1D) is different from the semiconductor device (1A) according to the first embodiment in that it includes a first result determination circuit (102), a first timer (104), a second result determination circuit (202) and a second timer (204) instead of the first result compression circuit (206), the second result compression circuit (207) and the common result determination device (5) (the timer (205), the recursive compression circuit (208) and the comparison circuit (209) ), and further includes cutoff circuits (16, 17).

The first result determination circuit (102) includes the first result compression circuit (206), the recursive compression circuit (208), and the comparison circuit (209) (not shown). The second result determination circuit (202) includes the second result compression circuit (207), the recursive compression circuit (208), and the comparison circuit (209) (not shown).

Specifically, while the semiconductor device (1A) according to the first embodiment includes, as a circuit to determine a test result, the common result determination device (5) that is used in common for the diagnosis at startup and the diagnosis during operation, the semiconductor device (1D) according to the fourth embodiment includes, as a circuit to determine a test result, circuits that are used separately between the diagnosis at startup and the diagnosis during operation. The semiconductor device (1D) includes the first result determination circuit (102) and the first timer (104) as a circuit to be used for the diagnosis during operation, and includes the second result determination circuit (202) and the second timer (204) as a circuit to be used for the diagnosis at startup.

Thus, in the fourth embodiment, the first test control circuit (100), the pattern input circuit (101), a part of the first result determination circuit (102) (the first result compression circuit (206)), and the first expected value storage circuit (103) function as the first test control device (3). Further, the second test control circuit (200), the pattern generation circuit (201), apart of the second result determination circuit (202) (the second result compression circuit (207)), and the second expected value storage circuit (203) function as the second test control device (4).

The first result determination circuit (102) acquires test results output from the scan chains of the CPU (10), and compresses the acquired test results by the first result compression circuit (206) and the recursive compression circuit (208). The first result determination circuit (102) compares, by the comparison circuit (209), the compressed test result with a first expected value that is output from the first expected value storage circuit (103). Note that a specific method of compressing test results, the details of a notification to the system control circuit (15) in accordance with a comparison result and the like are the same as those in the first embodiment and thus not redundantly described.

The semiconductor device (1D) includes an operating diagnosis device (20) that includes the first test control circuit (100), the pattern input circuit (101), the first result determination circuit (102), the first expected value storage circuit (103) and the first timer (104). The operating diagnosis device (20) has a plurality of scan chains for conducting a scan test of itself. Note that, among the scan chains of the operating diagnosis device (20), the scan chains in the CPU (10) may be common to the scan chains in the CPU (10) that are used by the first test control device (3). Then, in the fourth embodiment, differently from the first embodiment, a circuit as a target of a scan test by the second test control device (4) is the operating diagnosis device (20) that includes the CPU (10), not only the CPU (10). Therefore, in the fourth embodiment, differently from the first embodiment, the pattern generation circuit (201) inputs test patterns to the scan chains of the operating diagnosis device (20), not only to the scan chains of the CPU (10).

The second result determination circuit (202) acquires test results output from the scan chains of the operating diagnosis device (20), and compresses the acquired test results by the second result compression circuit (207) and the recursive compression circuit (208). The second result determination circuit (202) compares, by the comparison circuit (209), the compressed test result with a second expected value that is output from the second expected value storage circuit (203). Note that a specific method of compressing test results, the details of a notification to the system control circuit (15) in accordance with a comparison result and the like are the same as those in the first embodiment and thus not redundantly described.

The operation of each of the first timer (104) and the second timer (204) is substantially the same as the operation of the timer (205) and thus not redundantly described. Note that, however, the first timer (104) does not monitor a scan test execution time by the second test control circuit (200) and monitors a scan test execution time by the first test control circuit (100). The second timer (204) does not monitor a scan test execution time by the first test control circuit (100) and monitors a scan test execution time by the second test control circuit (200).

Thus, when initiating a scan test, the first test control circuit (100) outputs an initiation notification signal that notifies the initiation of a scan test to the first timer (104). When the scan test ends, the first test control circuit (100) outputs a termination notification signal that notifies the termination of the scan test to the first timer (104).

Further, when initiating a scan test, the second test control circuit (200) outputs an initiation notification signal that notifies the initiation of a scan test to the second timer (204). When the scan test ends, the second test control circuit (200) outputs a termination notification signal that notifies the termination of the scan test to the second timer (204).

The cutoff circuit (16) cuts off a signal that is output from the system bus (13) to the operating diagnosis device (20) during a scan test in the diagnosis at startup. This signal is a signal that is output from the system bus (13) to each of the CPU (10), the pattern input circuit (101) and the first test control circuit (100). Further, the cutoff circuit (16) cuts off a signal that is output from the operating diagnosis device (20) to the system bus (13) during a scan test in the diagnosis at startup. This signal is a signal that is output from each of the CPU (10), the pattern input circuit (101) and the first test control circuit (100) to the system bus (13).

It is thereby possible to prevent that the operating diagnosis device (20) malfunctions due to a signal that is output from the system bus (13) to the operating diagnosis device (20) during the diagnosis at startup, and a test result that is different from the second expected value is obtained despite that the operating diagnosis device (20) is not failed. It is also possible to prevent that malfunction of a circuit (the internal memory (11), the external I/F (12) etc.) that is connected to the system bus (13) occurs due to a signal that is output unintentionally from the operating diagnosis device (20) to the system bus (13) during the diagnosis at startup.

The cutoff circuit (17) cuts off a signal that is output from the operating diagnosis device (20) to the system control circuit (15) during a scan test in the diagnosis at startup. This signal is a notification signal that is output from the first result determination circuit (102) (the comparison circuit (209)) and a notification signal that is output from the first timer (104), for example. It is thereby possible to prevent false detection of an error due to a notification signal that is output unintentionally from the operating diagnosis device (20) to the system control circuit (15) during the diagnosis at startup.

Further, in the fourth embodiment, because a circuit to make a diagnosis is not used in common but different circuits are used respectively for the diagnosis at startup and the diagnosis during operation, and therefore the selection circuits (300, 301, 302) are not needed. Thus, the semiconductor device (1D) according to the fourth embodiment does not include the selection circuits (300, 301, 302), differently from the semiconductor device (1A) according to the first embodiment.

[Operation]

Figure 9:
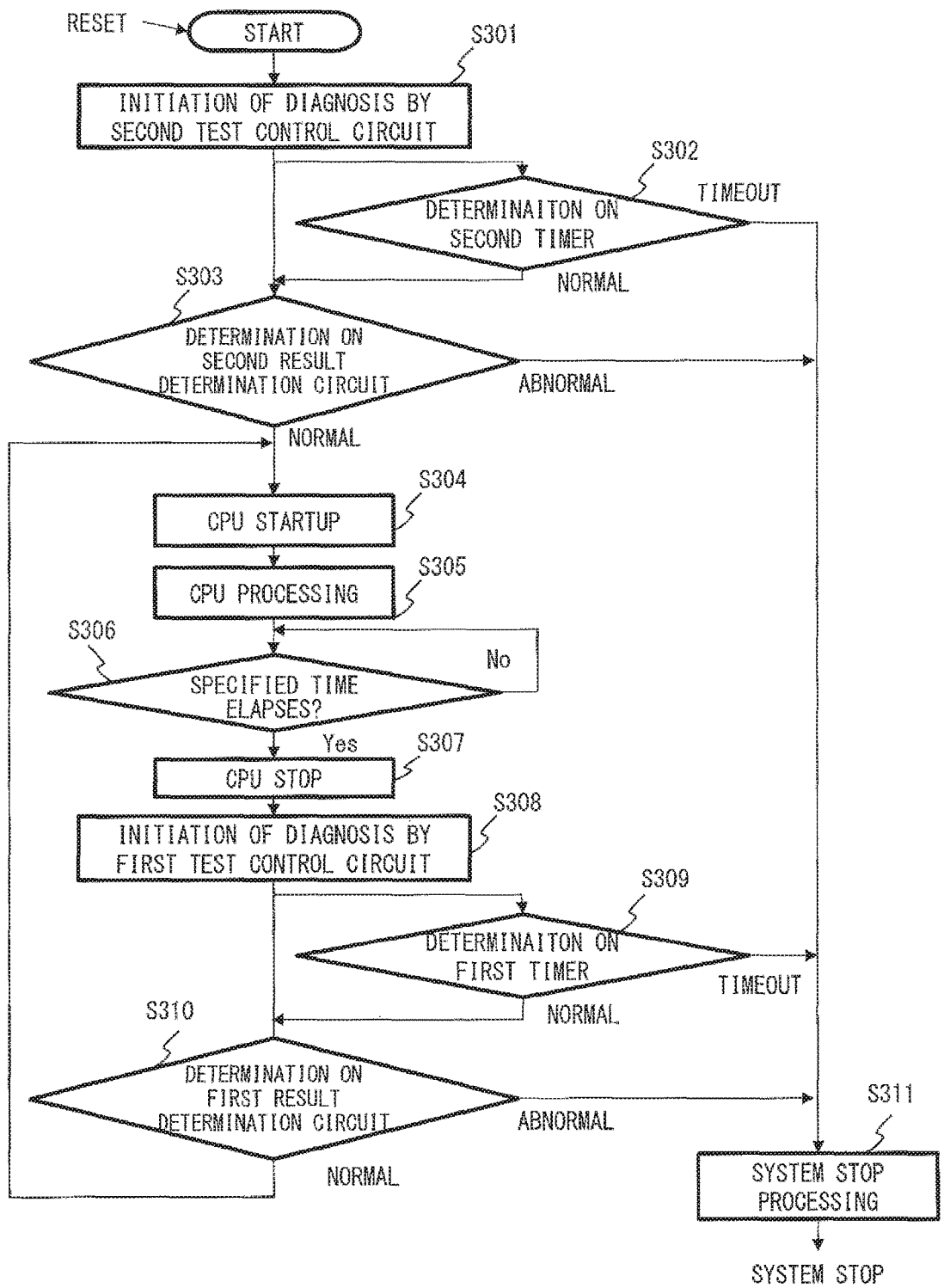
FIG. 9 is a block diagram showing the operation of the semiconductor device according to the fourth embodiment.

The operation during self-diagnosis of the semiconductor device (1D) according to the fourth embodiment is described hereinafter with reference to FIG. 9. FIG. 9 is a flowchart showing the operation during self-diagnosis of the semiconductor device (1D) according to the fourth embodiment.

In FIG. 9, operational events are connected by arrows, and events are performed in chronological order according to the orientation of arrows. A branching arrow indicates parallel execution of processing. Note that a rhombus-shaped event represents conditional branching. In a rhombus-shaped operational event, a downward-facing arrow basically indicates the next processing when a result is normal for the event. The operation according to the fourth embodiment is described with reference to the example of the semiconductor device (1D) shown in FIG. 8 and the operation flow shown in FIG. 9.

[Operation Flow]

When the semiconductor device (1D) is powered on and the reset of circuits (200 to 204) for which the diagnosis at startup is performed is cancelled, the semiconductor device (1D) initiates the diagnosis at startup. When the diagnosis at startup is initiated, the system control circuit (15) asserts a diagnosis initiation signal that gives an instruction to initiate a diagnosis of the operating diagnosis device (20) and outputs it to the second test control circuit (200). In response to assertion of the diagnosis initiation signal, the second test control circuit (200) initiates a diagnosis of the operating diagnosis device (20) (S301).

When diagnosis is initiated (before a scan test of the operating diagnosis device (20) is initiated), the second test control circuit (200) controls the cutoff circuit (16) to cut off a signal that is transmitted between the system bus (13) and the operating diagnosis device (20). Further, the second test control circuit (200) controls the cutoff circuit (17) to cut off a signal that is transmitted between the system bus (13) and the operating diagnosis device (20). This prevents malfunction of the system bus (13) and the system control circuit (15) during diagnosis or the like as described above.

When diagnosis is initiated, the second test control circuit (200) outputs, to the second timer (204), an initiation notification signal that notifies the initiation of a scan test to be performed on the CPU (10). A specific determination and an operation in accordance with a determination result (S302) of the second timer (204) are the same as those of the timer (205) (the same as in Step S102 of FIG. 1), and the description thereof is omitted. Note that control of the second timer (204) may be made by the system control circuit (15), not only by the second test control circuit (200) as described above.

To initiate a diagnosis of the operating diagnosis device (20), the second test control circuit (200) gives the pattern generation circuit (201) an instruction to generate test patterns, and performs a scan test of the operating diagnosis device (20). Note that the operation in the scan test is the same as that in the first embodiment except that the test is performed not only on the CPU (10) but on the operating diagnosis device (20) including the CPU (10), and therefore the description thereof is omitted.

The second result determination circuit (202) compresses the test result acquired from the operating diagnosis device (20), and determines whether the compressed test result and the second expected value that is stored in the second expected value storage circuit (203) match or not (S303).

The second result determination circuit (202) outputs a notification signal for notifying normal to the system control circuit (15) when the comparison result is a match (S303: Normal), and outputs a notification signal for notifying error to the system control circuit (15) when the comparison result is a mismatch (S303: Abnormal), just like in the first embodiment (Step S103 in FIG. 1).

Further, after the scan test ends (after all test results are output from the scan chains), the second test control circuit (200) controls the cutoff circuit (16) not to cut off a signal that is transmitted between the system bus (13) and the operating diagnosis device (20). The second test control circuit (200) also controls the cutoff circuit (17) not to cut off a signal that is transmitted between the system bus (13) and the operating diagnosis device (20).

When a diagnosis result of the operating diagnosis device (20) is normal (S303: Normal), the test control circuit (105) initiates the startup of the CPU (10) (S304), and the CPU (10) performs processing (S305), just like in Steps S104 and S105 of FIG. 1 described in the first embodiment. Each time a specified time elapses (S306: Yes), the CPU (10) gives the first test control circuit (100) an instruction to diagnose the CPU (10) and stops its processing (S307), just like in Steps S106 and S107 of FIG. 1 described in the first embodiment. In response to the instruction from the CPU (10), the first test control circuit (100) initiates a diagnosis of the CPU (10), just like in Step S108 of FIG. 1 described in the first embodiment (S308).

When diagnosis is initiated, the first test control circuit (100) outputs, to the first timer (104), an initiation notification signal that notifies the initiation of a scan test to be performed on the CPU (10). A specific determination and an operation in accordance with a determination result (S309) of the first timer (104) are the same as those of the timer (205) (the same as in Step S109 of FIG. 1), and the description thereof is omitted. Note that control of the first timer (104) may be also made by the system control circuit (15), not only by the first test control circuit (100) as described above.

To initiate a diagnosis of the CPU (10), the first test control circuit (100) gives the pattern input circuit (101) an instruction to input test patterns through the system bus (13), and performs a scan test of the CPU (10). Note that the operation in the scan test is the same as that in the first embodiment, and therefore the description thereof is omitted.

The first result determination circuit (102) compresses the test result acquired from the CPU (10), and determines whether the compressed test result and the first expected value that is stored in the first expected value storage circuit (103) match or not (S310).

The first result determination circuit (102) outputs a notification signal for notifying normal to the system control circuit (15) when the comparison result is a match (S310: Normal), and outputs a notification signal for notifying error to the system control circuit (15) when the comparison result is a mismatch (S310: Abnormal), just like in the first embodiment (Step S110 in FIG. 1). When an error is notified from the first timer (104), the second timer (204), the first result determination circuit (102) or the second result determination circuit (202), the system control circuit (15) promptly performs processing to stop the system in the semiconductor device (1D) and thereby stops the system in the semiconductor device (1D) (S311), just like in Step S111 of FIG. 1 described in the first embodiment.

[Features and Effects]

In the fourth embodiment, the diagnosis at startup for detecting LF is performed on the entire operating diagnosis device (20) including the CPU (10). Stated differently, a scan test of the first test control device (3), together with the CPU (10), is carried out. In this configuration, by performing a scan test of the single CPU (10) during operation, it is possible to ensure the safety at lower cost than making the CPU redundant, and also ensure the safety of circuits (10, 100 to 104) used for the diagnosis during operation as well.

<Fifth Embodiment>

A fifth embodiment is described hereinafter. In the following description of the fifth embodiment, the same elements as in the fourth embodiment described above are denoted by the same reference symbols or the like, and the explanation of the same is omitted as appropriate.

[Configuration]

Figure 10:
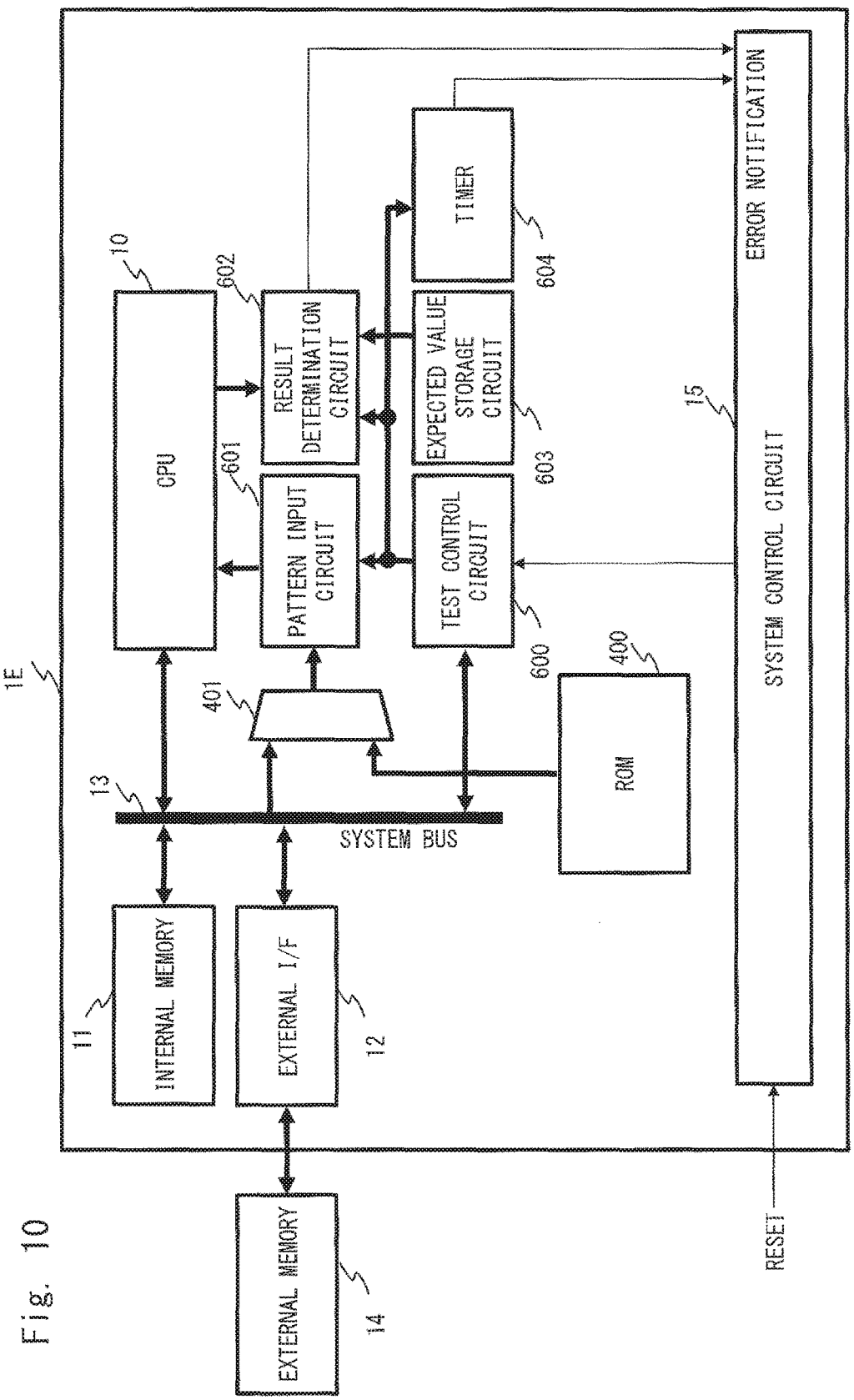
FIG. 10 is a block diagram showing the configuration of a semiconductor device according to a fifth embodiment.

The configuration of a semiconductor device (1E) according to the fifth embodiment is described hereinafter with reference to FIG. 10. FIG. 10 is a block diagram showing the configuration of the semiconductor device (1E) according to the fifth embodiment. As shown in FIG. 10, the semiconductor device (1E) is different from the semiconductor device (1E) according to the fourth embodiment in that it does not include the cutoff circuits (16), (17), the second test control circuit (200), the pattern generation circuit (201), the second result determination circuit (202), the second expected value storage circuit (203), and the second timer (204). Further, the semiconductor device (1E) is different from the semiconductor device (1E) according to the fourth embodiment in that it includes a test control circuit (600), a pattern input circuit (601), a result determination circuit (602), an expected value storage circuit (603), and a timer (604) instead of the first test control circuit (100), the pattern input circuit (101), the first result determination circuit (102), the first expected value storage circuit (103) and the first timer (104). Further, the semiconductor device (1E) is different from the semiconductor device (1E) according to the fourth embodiment in that it includes a ROM (400) and a selection circuit (401).

In the fifth embodiment, both of the diagnosis at startup and the diagnosis during operation are performed by the test control circuit (600), the pattern input circuit (601), the result determination circuit (602), the expected value storage circuit (603) and the timer (604). Specifically, in the fifth embodiment, the result determination circuit (602) includes the first result compression circuit (206), the second result compression circuit (207), the recursive compression circuit (208), and the comparison circuit (209) (not shown).

Thus, in the fifth embodiment, the test control circuit (600), the pattern input circuit (601), a part of the result determination circuit (602) (the first result compression circuit (206) and the second result compression circuit (207)), the expected value storage circuit (603) and the timer (604) function as the first test control device (3) and the second test control device (4). Further, the expected value storage circuit (603) prestores both of the first expected value to be used for the diagnosis during operation and the second expected value to be used for the diagnosis at startup.

The test control circuit (600) is different from the first test control circuit (100) according to the fourth embodiment in that it further performs a scan test of the CPU (10) in the diagnosis at startup. Specifically, the test control circuit (600) conducts a scan test of the CPU (10) in the diagnosis at startup in response to a request from the system control circuit (15) at the startup of the semiconductor device (1E).

The pattern input circuit (601) is connected to the system bus (13) and the ROM (400) through the selection circuit (401). The ROM (400) stores a plurality of test patterns used for the diagnosis at startup. The selection circuit (401) selectively outputs the test pattern that is output from one of the system bus (13) and the ROM (400) to the pattern input circuit (601).

When initiating the diagnosis at startup, the selection circuit (401) is controlled by the test control circuit (600) or the system control circuit (15) so that the ROM (400) side is selected for connection with the pattern input circuit (601). For example, the test control circuit (600) may make control in response to assertion of a diagnosis initiation signal from the system control circuit (15), or the system control circuit (15) may make control before assertion of a diagnosis initiation signal.

In the diagnosis at startup, the pattern input circuit (101) reads test patterns from the ROM (400) in response to a request from the first test control circuit (100), and supplies them to the scan chains of the CPU (10).

The result determination circuit (602) acquires test results output from the scan chains of the CPU (10), and compresses the acquired test results by the second result compression circuit (207) and the recursive compression circuit (208), just like the second result determination circuit (202) according to the fourth embodiment. The result determination circuit (602) compares, by the comparison circuit (209), the compressed test result with a second expected value that is output from the expected value storage circuit (603). Thus, the result determination circuit (602) makes a diagnosis of the CPU (10) rather than the operating diagnosis device (20), which is different from the second result determination circuit (202). Note that a specific method of compressing test results, the details of a notification to the system control circuit (15) in accordance with a comparison result and the like are the same as those in the second result determination circuit (202) according to the fourth embodiment and thus not redundantly described.

The operation of the timer (604) is substantially the same as the operation of the timer (205) according to the first embodiment and thus not redundantly described. Note that, however, the timer (604) is different from the timer (205) according to the first embodiment in that it monitors a scan test execution time by the test control circuit (600) in both of the diagnosis at startup and the diagnosis during operation, not monitoring a scan test execution time by the test control circuits (100, 200), which are different between the diagnosis at startup and the diagnosis during operation.

The operations of the test control circuit (600), the pattern input circuit (601), the result determination circuit (602) and the timer (604) in the diagnosis during operation are the same as the operations of the first test control circuit (100), the pattern input circuit (101), the first result determination circuit (102) and the first timer (104) according to the fourth embodiment, and therefore the description thereof is omitted. Note that, in the fifth embodiment, when initiating the diagnosis during operation, the selection circuit (401) is controlled by the test control circuit (600) or the CPU (10) so that the system bus (13) side is selected for connection with the pattern input circuit (601). For example, the test control circuit (600) may make control in response to assertion of a diagnosis initiation signal from the CPU (10), or the CPU (10) may make control before assertion of a diagnosis initiation signal.

[Operation]

The operation of the semiconductor device (1E) according to the fifth embodiment is substantially the same as the operation of the semiconductor device (1D) according to the fourth embodiment (the operation shown in FIG. 9), and therefore the description thereof is omitted. Note that, however, the operation of the semiconductor device (1E) is different from the operation of the semiconductor device (1D) in that both of the diagnosis at startup and the diagnosis during operation are performed by the test control circuit (600), the pattern input circuit (601), the result determination circuit (602) and the timer (604), the selection circuit (401) is controlled at the initiation of the diagnosis at startup and the diagnosis during operation, and test patterns in the diagnosis at startup are not generated but acquired from the ROM (400).

[Features and Effects]

In the fifth embodiment, a circuit to perform the diagnosis at startup and the diagnosis during operation is used in common. At the startup, many modules including the system bus (13) are in the resting state for the diagnosis. Therefore, it is difficult to acquire test patterns through the system bus (13). In view of this, test data to be used in the diagnosis at startup is stored in the dedicated ROM (400) in the fifth embodiment. Specifically, during the initialization of the system bus (13), test patterns are acquired from the ROM (400), and the acquired test patterns are input to the scan chains of the CPU (10), and a scan test in the diagnosis at startup is carried out. Then, after the initialization of the system bus (13), test patterns are acquired from the external memory (14) through the system bus (13), and the acquired test patterns are input to the scan chains of the CPU (10), and a scan test in the diagnosis during operation is carried out. In this configuration, by performing a scan test of the single CPU (10) during operation and using a circuit to perform the diagnosis at startup and the diagnosis during operation in common, it is possible to ensure the safety at lower cost than making the CPU redundant, and also ensure the safety of a diagnosis device used for the diagnosis during operation as well.

<Sixth Embodiment>

A sixth embodiment is described hereinbelow. In the following description of the sixth embodiment, the same elements as in the fifth embodiment described above are denoted by the same reference symbols or the like, and the explanation of the same is omitted as appropriate.

[Configuration]

Figure 11:
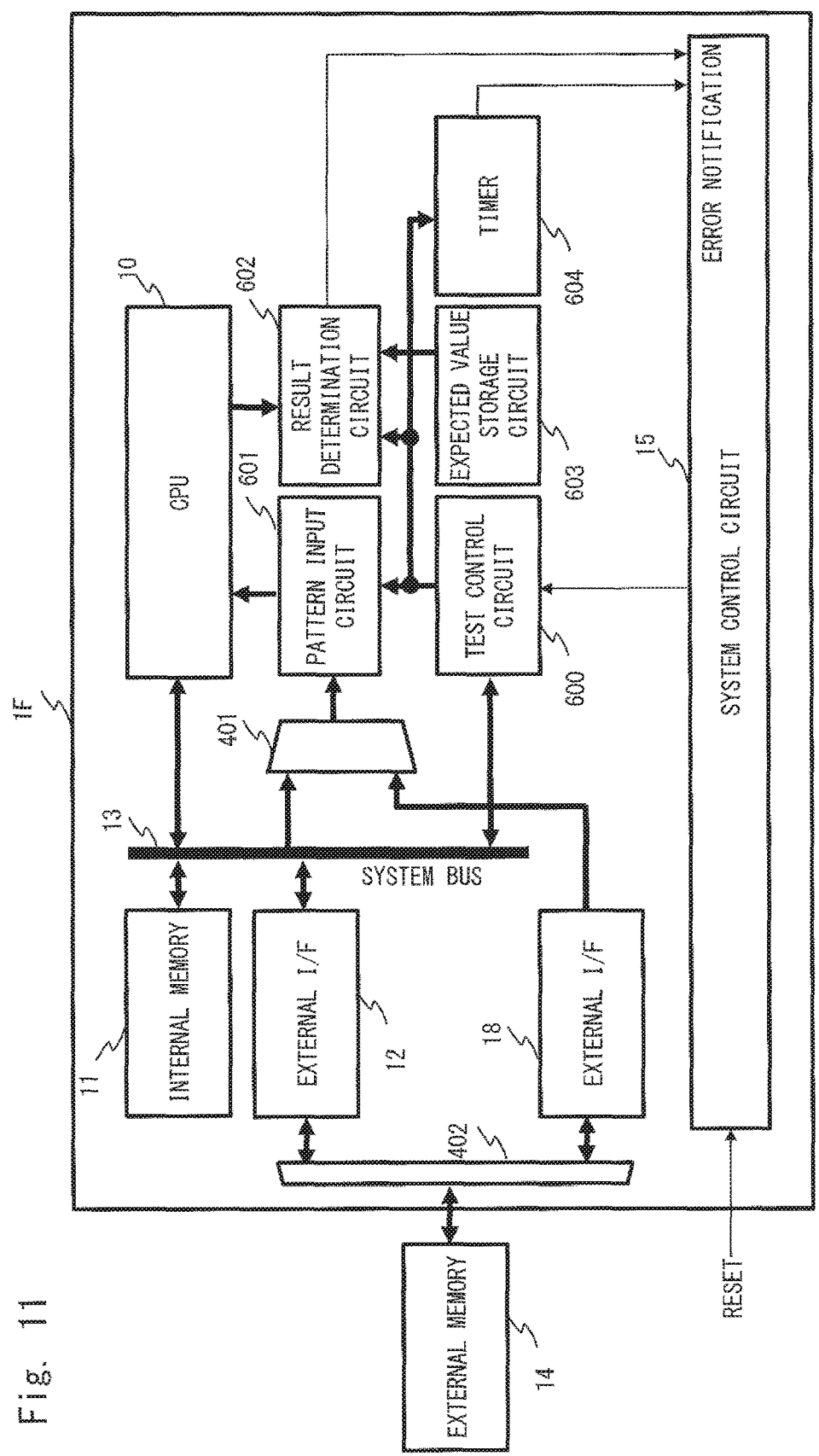
FIG. 11 is a block diagram showing the configuration of a semiconductor device according to a sixth embodiment.

The configuration of a semiconductor device (1F) according to the sixth embodiment is described hereinafter with reference to FIG. 11. FIG. 11 is a block diagram showing the configuration of the semiconductor device (1F) according to the sixth embodiment. As shown in FIG. 11, the semiconductor device (1F) is different from the semiconductor device (1E) according to the fifth embodiment shown in FIG. 10 in that it includes an external I/F (18) and a selection circuit (402). Further, the semiconductor device (1F) is different from the semiconductor device (1E) according to the fifth embodiment in that it does not include the ROM (400).

In the sixth embodiment, differently from the fifth embodiment, the external memory (14) stores both of test patterns used in the diagnosis at startup and test patterns used in the diagnosis during operation. Further, in the sixth embodiment, differently from the fifth embodiment, the external I/F (18), instead of the ROM (400), is connected to the selection circuit (401). Further, the external memory (14) is connected to the external I/F (12) and the external I/F (18) through the selection circuit (402). The external I/F (18) is a circuit that transmits and receives data between the external memory 14 and the selection circuit (401) through the selection circuit (402).

Specifically, in the sixth embodiment, the selection circuit (401) selectively outputs the test pattern that is input from one of the system bus (13) and the external I/F (18) to the pattern input circuit (601). Further, the selection circuit (402) selectively outputs the test pattern that is input from the external memory (14) to one of the external I/F (12) and the external I/F (18).

Thus, in the sixth embodiment, when initiating the diagnosis at startup, the selection circuit (401) is controlled by the test control circuit (600) or the system control circuit (15) so that the external I/F (18) side is selected for connection with the pattern input circuit (601). Further, when initiating the diagnosis at startup, the selection circuit (402) is controlled by the test control circuit (600) or the system control circuit (15) so that the external I/F (18) side is selected for connection with the external memory (14). For example, the test control circuit (600) may make control in response to assertion of a diagnosis initiation signal from the system control circuit (15), or the system control circuit (15) may make control before assertion of a diagnosis initiation signal.

Thus, in the diagnosis at startup, the pattern input circuit (601) reads test patterns from the external memory (14) through the external I/F (18), without through the system bus (13), in response to a request from the first test control circuit (100), and supplies them to the scan chains of the CPU (10).

Then, when initiating the diagnosis during operation, the selection circuit (401) is controlled by the test control circuit (600) or the CPU (10) so that the system bus (13) side is selected for connection with the pattern input circuit (601). Further, when initiating the diagnosis during operation, the selection circuit (402) is controlled by the test control circuit (600) or the CPU (10) so that the external I/F (12) side is selected for connection with the external memory (14). For example, the test control circuit (600) may make control in response to assertion of a diagnosis initiation signal from the CPU (10), or the CPU (10) may make control before assertion of a diagnosis initiation signal Note that the operation in the diagnosis during operation is the same as that of the fifth embodiment, and thus not redundantly described.

[Operation]

The operation of the semiconductor device (1F) according to the sixth embodiment is substantially the same as the operation of the semiconductor device (1E) according to the fifth embodiment, and therefore the description thereof is omitted. Note that, however, the operation of the semiconductor device (1F) is different from the operation of the semiconductor device (1E) in that the selection circuit (402) is further controlled when initiating the diagnosis at startup and the diagnosis during operation, and test patterns in the diagnosis at startup are acquired not from the ROM (400) but from the external memory (14).

[Features and Effects]

In the sixth embodiment, just like the fifth embodiment, a circuit to perform the diagnosis at startup and the diagnosis during operation is used in common. Specifically, in the sixth embodiment, during the initialization of the system bus (13), test patterns are acquired from the external memory (14) through the external I/F (18), and the acquired test patterns are input to the scan chains of the CPU (10), and a scan test in the diagnosis at startup is carried out. Then, after the initialization of the system bus (13), test patterns are acquired from the external memory (14) through the system bus (13), and the acquired test patterns are input to the scan chains of the CPU (10), and a scan test in the diagnosis during operation is carried out. In this configuration, by performing a scan test of the single CPU (10) during operation and using a circuit to the diagnosis at startup and the diagnosis during operation in common, it is possible to ensure the safety at lower cost than making the CPU redundant, and also ensure the safety of a diagnosis device used for the diagnosis during operation as well. Further, because the semiconductor device (1F) does not need to include the ROM (400), it is possible to further reduce costs.

<Seventh Embodiment>

A seventh embodiment is described hereinbelow. In the following description of the seventh embodiment, the same elements as in the first embodiment described above are denoted by the same reference symbols or the like, and the explanation of the same is omitted as appropriate.

[Overall Configuration]

Figure 12:
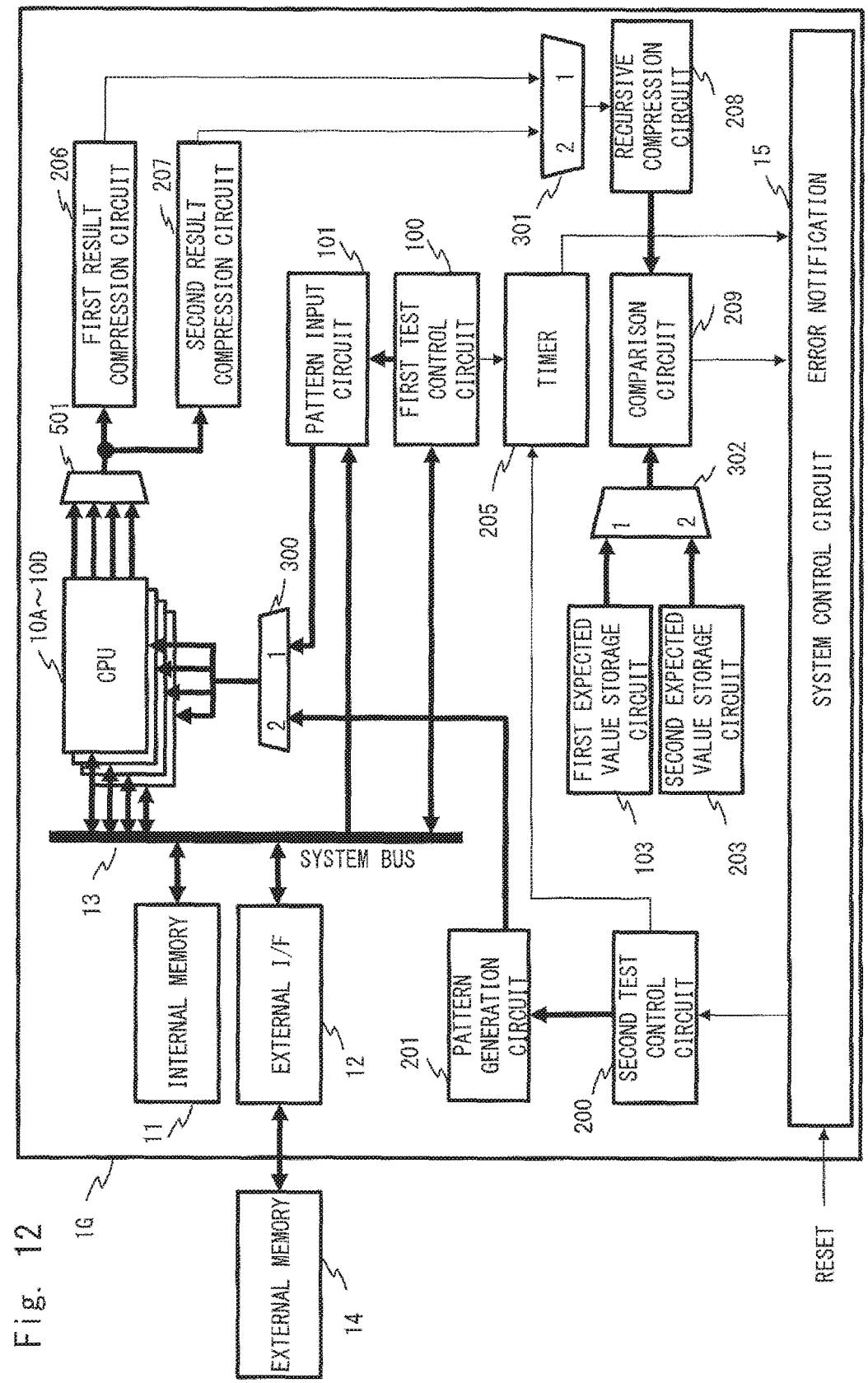
FIG. 12 is a block diagram showing the configuration of a semiconductor device according to a seventh embodiment.

The configuration of a semiconductor device (1G) according to the seventh embodiment is described hereinafter with reference to FIG. 12. FIG. 12 is a block diagram showing the configuration of the semiconductor device (1G) according to the seventh embodiment. As shown in FIG. 12, the semiconductor device (1G) is different from the semiconductor device (1A) according to the first embodiment in that it includes not one CPU (10) but a plurality of CPUs (10A to 10D). Further, the semiconductor device (1G) is different from the semiconductor device (1A) according to the first embodiment in that it includes a selection circuit (501).

Each of the CPUs (10A to 10D) is the same as the CPU (10) according to the first embodiment, and the description thereof is omitted. Specifically, the semiconductor device (1G) employs a multiprocessor configuration on which a plurality of CPUs with the same structure are mounted.

[First Test Control Device (3)]

The first test control circuit (100) is connected to each of the CPUs (10A to 10D) through the system bus (13). The first test control circuit (100) performs a scan test of the CPU (10A) in response to a request from the CPU (10A), performs a scan test of the CPU (10B) in response to a request from the CPU (10B), performs a scan test of the CPU (10C) in response to a request from the CPU (10C), and performs a scan test of the CPU (10D) in response to a request from the CPU (10D).

All of the CPUs (10A to 10D) are connected to the pattern input circuit (101) and the pattern input circuit (201) through the selection circuit (300). Specifically, the test patterns output from each of the pattern input circuit (101) and the pattern input circuit (201) are input to all of the CPUs (10A to 10D) through the selection circuit (300).

When performing a scan test, the first test control circuit (100) asserts a scan enable signal that is to be output to a CPU to be tested, and continuously negates scan enable signals that are to be output to the other CPUs, among scan enable signals to be respectively output to the CPUs (10A to 10D).

During the period when the asserted scan enable signal is input, each of the CPUs (10A to 10D) performs a scan shift operation, and scans test patterns input through the selection circuit (300) into the scan chain of itself, and scans test results stored in those scan chains out. On the other hand, during the period when the negated scan enable signal is input, each of the CPUs (10A to 10D) does not perform a scan shift operation, and does not scan test patterns input through the selection circuit (300) into the scan chain of itself, and does not scan test results stored in those scan chains out.

In this operation, it is possible to perform a scan test only on a CPU to be tested, and a CPU that is not to be tested can continue the normal operation.

[Second Test Control Second Test Control Device (4)]

In the seventh embodiment, just like in the first embodiment, the second test control circuit (200) performs a scan test of each of the CPUs (10A to 10D) in response to a request from the system control circuit (15). Note that, however, in the seventh embodiment, differently from the first embodiment, the system control circuit (15) specifies, by this request, a CPU to be tested for the second test control circuit (200). The second test control circuit (200) performs a scan test of the CPU that is specified by the system control circuit (15).

The second test control circuit (200), like the first test control circuit (100), asserts a scan enable signal for a CPU to be tested and thereby performs a scan test of the CPU to be tested. The specific operation is the same as described above, and the description thereof is omitted.

[Common Result Determination Device (5)]

The first result compression circuit (206) and the second result compression circuit (207) are connected to each of the CPUs (10A to 10D) through the selection circuit (501). The selection circuit (501) selectively outputs the test result that is output from one of the CPUs (10A to 10D) to each of the first result compression circuit (206) and the second result compression circuit (207). When initiating the diagnosis at startup, the selection circuit (501) is controlled by the second test control circuit (200) or the system control circuit (15) so that the CPU to be tested is selected for connection with the first result compression circuit (206) and the second result compression circuit (207). For example, each of the second test control circuit (200A to 200D) may make control in response to assertion of a diagnosis initiation signal from the system control circuit (15), or the system control circuit (15) may make control before assertion of a diagnosis initiation signal.

Further, when initiating the diagnosis during operation, the selection circuit (501) is controlled by the first test control circuit (100) or the CPU to be tested so that the CPU to be tested is selected for connection with the first result compression circuit (206) and the second result compression circuit (207). For example, the first test control circuit (100) may make control in response to assertion of a diagnosis initiation signal from the CPU to be tested, or the CPU to be tested may make control before assertion of a diagnosis initiation signal.

The first result compression circuit (206) and the second result compression circuit (207) can thereby acquire test results from the CPU on which a scan test is performed and compress the results. Note that the operation of the common result determination device (5) is the same as that in the first embodiment and thus not redundantly described.

[Operation]

Figure 13:
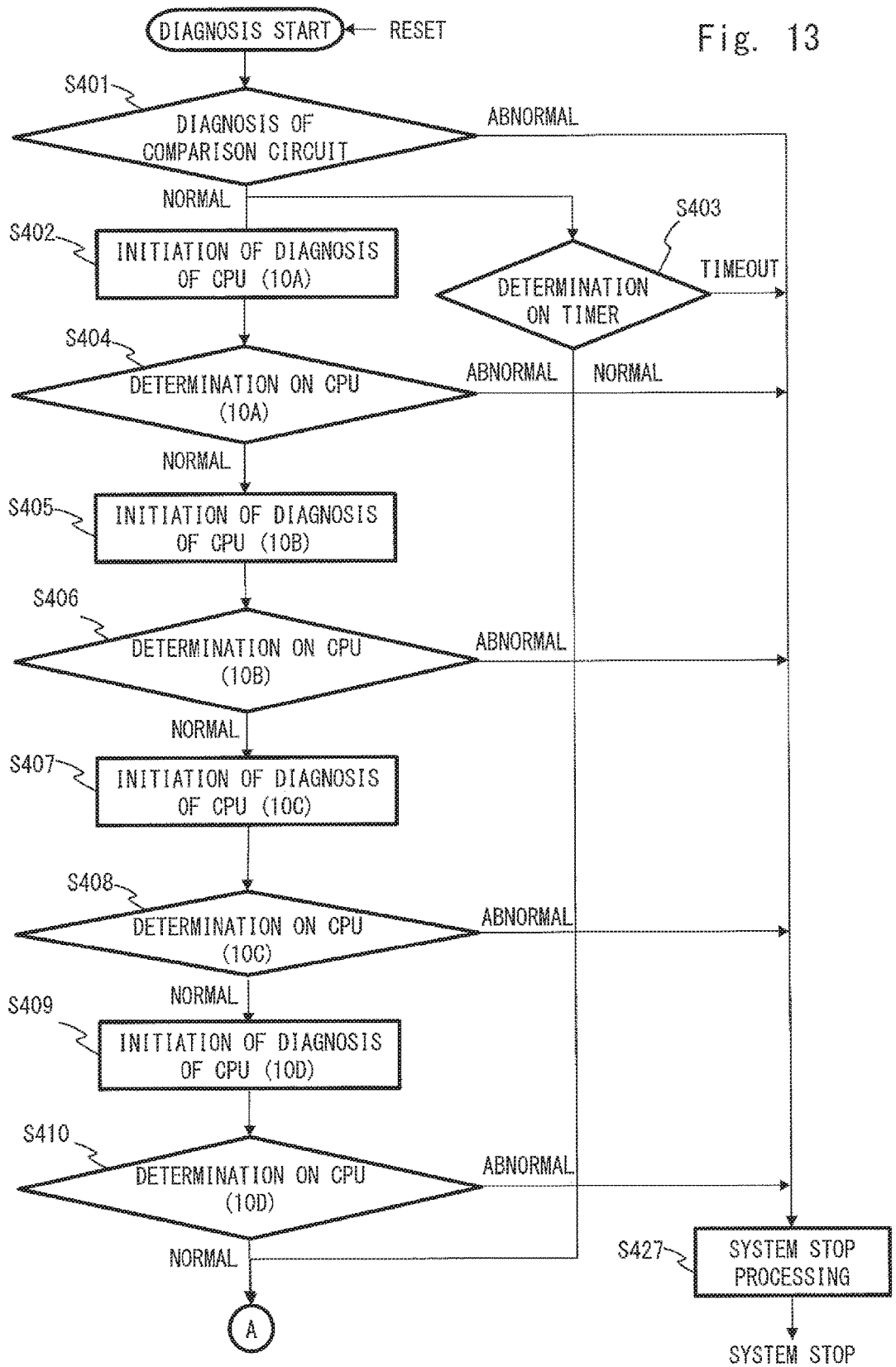
FIG. 13 is a block diagram showing the first-half operation of the semiconductor device according to the seventh embodiment.
Figure 14:
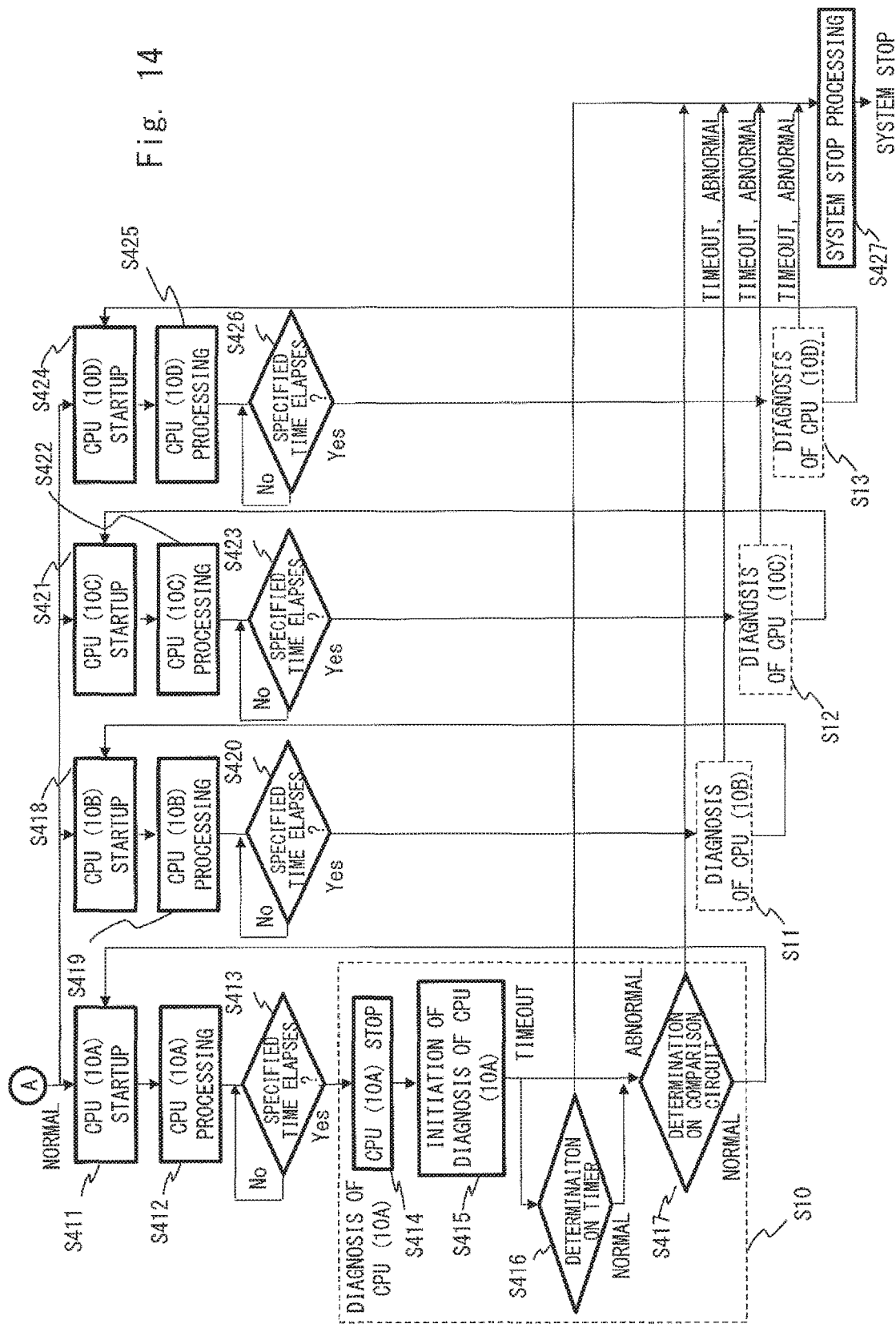
FIG. 14 is a block diagram showing the second-half operation of the semiconductor device according to the seventh embodiment.

The operation during self-diagnosis of the semiconductor device (1G) according to the seventh embodiment is described hereinafter with reference to FIGS. 13 and 14. FIGS. 13 and 14 are flowcharts showing the operation during self-diagnosis of the semiconductor device (1G) according to the seventh embodiment.

In FIGS. 13 and 14, operational events are connected by arrows, and events are performed in chronological order according to the orientation of arrows. A branching arrow indicates parallel execution of processing. Note that a rhombus-shaped event represents conditional branching. In a rhombus-shaped operational event, a downward-facing arrow basically indicates the next processing when a result is normal for the event, and a rightward-facing arrow basically indicates the next processing when a result is abnormal for the event. The operation according to the seventh embodiment is described with reference to the example of the semiconductor device (1G) shown in FIG. 12 and the operation flow shown in FIGS. 13 and 14.

[Overall Operation Flow]

When the semiconductor device (1G) is powered on and the reset of the second test control device (4) and the common result determination device (5) is cancelled, the semiconductor device (1G) makes a diagnosis for detecting LF first. The diagnosis at startup is carried out on each of the CPUs (10A to 10D) in a specified order. When LF is not detected, the semiconductor device (1G) starts the normal operation.

Further, during the normal operation, the semiconductor device (1G) suspends the processing of any one of the CPUs (10A to 10D) and makes the diagnosis during operation for detecting SPF in the CPU whose processing is suspended at regular intervals. When SPF is not detected, the semiconductor device (1G) allows the CPU on which the diagnosis at startup is performed to resume the normal operation. Note that the diagnosis operation for detecting SPF is carried out on each of the CPUs (10A to 10D) in a specified order, and it is not carried out simultaneously on two or more CPUs.

[Diagnosis at Startup Flow (LF Detection Flow)]

When the diagnosis at startup is initiated, the system control circuit (15) makes a diagnosis of the comparison circuit (209) (S401). The system control circuit (15) asserts a diagnosis initiation signal that gives an instruction to initiate a diagnosis of the comparison circuit (209) and outputs it to the second test control circuit (200). In response to assertion of the diagnosis initiation signal that gives an instruction to initiate a diagnosis of the comparison circuit (209), the second test control circuit (200) makes a diagnosis of the comparison circuit (209). The operation in this Step S401 is the same as the operation in Step S112 of FIG. 4 which is described in the modified example of the first embodiment, and the description thereof is omitted.

Then, the system control circuit (15) asserts a diagnosis initiation signal that gives an instruction to initiate a diagnosis of the CPU (10A) and outputs it to the second test control circuit (200). In response to assertion of the diagnosis initiation signal that gives an instruction to initiate a diagnosis of the CPU (10A), the second test control circuit (200) initiates a diagnosis of the CPU (10A) (S402). The specific operation in Step S402 is the same as the operation in Step S101 of FIG. 3 in the first embodiment, and the description thereof is omitted. The same applies to the operation on the CPU (10B to 10D), which is described later.

Note that, however, the seventh embodiment is different from the first embodiment in that the second test control circuit (200) or the system control circuit (15) controls the selection circuit (501) to select the CPU (10A) to be tested before initiating the diagnosis at startup of the CPU (10A).

Before initiating a diagnosis of the first CPU (10A), the second test control circuit (200) starts the timer (205), just like in Step S102 of FIG. 3 in the first embodiment (S403). A specific determination and a notification in accordance with a determination result by the timer (205) are substantially the same as those of Step S102 of FIG. 3 in the first embodiment, and the description thereof is omitted. Note that, however, in the seventh embodiment, the timer (205) monitors a time from the initiation of a diagnosis of the first CPU (10A) to the termination of a diagnosis of the last CPU (10D), which is described later.

After the end of a scan test in the CPU (10A), the comparison circuit (209) makes determination about test results obtained in the scan test (S404). Note that the specific operation in Step S404 is the same as that of Step S104 of FIG. 3 in the first embodiment, and the description thereof is omitted. The same applies to the operation on the CPU (10B to 10D), which is described later.

When a notification of error is given from the comparison circuit (209) as a diagnosis result of the CPU (10A) (S404: Abnormal), the system control circuit (15) promptly performs processing to stop the system and thereby stops the system (S423). In other words, the system control circuit (15) inhibits the starting of the semiconductor device (1G). The same applies to the operation on the CPU (10B to 10D), which is described later.

On the other hand, when a notification signal that notifies normal is output as a diagnosis result of the CPU (10A) from the comparison circuit (209) (S404: Normal), the system control circuit (15) asserts a diagnosis initiation signal that gives an instruction to initiate a diagnosis of the CPU (10B) and outputs it to the second test control circuit (200). In response to assertion of the diagnosis initiation signal that gives an instruction to initiate a diagnosis of the CPU (10B), the second test control circuit (200) initiates a diagnosis of the CPU (10B) (S405). Note that, before initiating the diagnosis at startup of the CPU (10B), the second test control circuit (200) or the system control circuit (15) controls the selection circuit (501) to select the CPU (10B) to be tested. Then, after the end of a scan test in the CPU (10B), the comparison circuit (209) makes determination about test results obtained in the scan test (S406).

When a notification signal that notifies normal is output as a diagnosis result of the CPU (10B) from the comparison circuit (209) (S406: Normal), the system control circuit (15) asserts a diagnosis initiation signal that gives an instruction to initiate a diagnosis of the CPU (10C) and outputs it to the second test control circuit (200). In response to assertion of the diagnosis initiation signal that gives an instruction to initiate a diagnosis of the CPU (10C), the second test control circuit (200) initiates a diagnosis of the CPU (10C) (S407). Note that, before initiating the diagnosis at startup of the CPU (10C), the second test control circuit (200) or the system control circuit (15) controls the selection circuit (501) to select the CPU (10C) to be tested. Then, after the end of a scan test in the CPU (10C), the comparison circuit (209) makes determination about test results obtained in the scan test (S408).

When a notification signal that notifies normal is output as a diagnosis result of the CPU (10C) from the comparison circuit (209) (S408: Normal), the system control circuit (15) asserts a diagnosis initiation signal that gives an instruction to initiate a diagnosis of the CPU (10D) and outputs it to the second test control circuit (200). In response to assertion of the diagnosis initiation signal that gives an instruction to initiate a diagnosis of the CPU (10D), the second test control circuit (200) initiates a diagnosis of the CPU (10D) (S409). Note that, before initiating the diagnosis at startup of the CPU (10D), the second test control circuit (200) or the system control circuit (15) controls the selection circuit (501) to select the CPU (10D) to be tested. Then, after the end of a scan test in the CPU (10D), the comparison circuit (209) makes determination about test results obtained in the scan test (S410).

Further, when a scan test of the last CPU (10D) ends, the second test control circuit (200) outputs a notification signal that notifies the termination of a scan test to the timer (205). In response to the notification signal from the second test control circuit (200), the timer (205) terminates the measurement of an elapsed time.

Note that monitoring by the timer (205) maybe performed each time the diagnosis at startup of each of the CPUs (10A to 10D) is carried out. For example, the second test control circuit (200) may output an initiation notification signal to the timer (205) when the execution of a scan test of each of the CPUs (10A to 10D) is to be initiated, and output a termination notification signal to the timer (205) when the execution of a scan test of each of the CPUs (10A to 10D) is terminated.

Further, the system in the semiconductor device (1G) may be boosted by fallbacking only on the CPU for which an error is notified as a diagnosis result and starting the remaining CPUs among the CPUs (10A to 10D).

[Diagnosis During Operation (SPF Detection Flow)]

When the diagnosis results of all the CPUs (10A to 10D) are normal, the system control circuit (15) initiates the startup of the all the CPUs (10A to 10D), just like in Steps S104 and S105 of FIG. 1 described in the first embodiment (S411, S418, S421, S424), and each of the CPUs (10A to 10D) performs processing (S412, S419, S422, S425).

This processing includes processing of making a self-diagnosis at regular intervals, just like in the first embodiment. In the seventh embodiment, it is controlled by the system control circuit (15) or by the coordination operation of the CPUs (10A to 10D) so that a plurality of CPUs do not enter the self-diagnosis mode at the same time. In the seventh embodiment, an example in which a self-diagnosis is carried out in the order of CPU (10A), CPU (10B), CPU (10C) and CPU (10D) is described.

First, when a specified time is elapsed (S413: Yes), the CPU (10A) makes a self-diagnosis (S10). Although the operation in Step S10 includes the operations in Steps S414 to S417, the specific operations are the same as those in Steps S107 to S110 of the first embodiment (FIG. 3), and the description thereof is omitted. Note that, before initiating the diagnosis during operation of the CPU (10A), the first test control circuit (100) or the CPU (10A) controls the selection circuit (501) so as to select the CPU (10A) to be tested. Further, the operation in the case where a diagnosis result is abnormal (S416: Abnormal or S417: Abnormal, S427) is also the same as the operation in Step S109: Abnormal or S110: Abnormal, S111 in the first embodiment (FIG. 3), and the description thereof is omitted.

When a diagnosis result of the CPU (10A) is normal (S417: Normal), the system control circuit (15) restarts the CPU (10A) (S411). After the restart, the CPU (10A) resumes the suspended processing (S412).

Next, when a specified time is elapsed (S420: Yes), the CPU (10B) makes a self-diagnosis (S11). Thus, the starting time of measurement of a specified elapsed time for the CPU (10B) is later than the starting time of measurement of a specified elapsed time for the CPU (10A). The operation in Step S11 is the same as the operation of Step S10, and the description thereof is omitted. Note that, before initiating the diagnosis during operation of the CPU (10B), the first test control circuit (100) or the CPU (10B) controls the selection circuit (501) so as to select the CPU (10B) to be tested. When a diagnosis result of the CPU (10B) is normal, the system control circuit (15) restarts the CPU (10B) (S418). After the restart, the CPU (10B) resumes the suspended processing (S419).

Next, when a specified time is elapsed (S423: Yes), the CPU (10C) makes a self-diagnosis (S12). Thus, the starting time of measurement of a specified elapsed time for the CPU (10C) is later than the starting time of measurement of a specified elapsed time for the CPU (10B). The operation in Step S12 is the same as the operation of Step S10, and the description thereof is omitted. Note that, before initiating the diagnosis during operation of the CPU (10C), the first test control circuit (100) or the CPU (10C) controls the selection circuit (501) so as to select the CPU (10C) to be tested. When a diagnosis result of the CPU (10C) is normal, the system control circuit (15) restarts the CPU (10C) (S421). After the restart, the CPU (10C) resumes the suspended processing (S422).

Next, when a specified time is elapsed (S426: Yes), the CPU (10D) makes a self-diagnosis (S13). Thus, the starting time of measurement of a specified elapsed time for the CPU (10D) is later than the starting time of measurement of a specified elapsed time for the CPU (10C). The operation in Step S13 is the same as the operation of Step S10, and the description thereof is omitted. Note that, before initiating the diagnosis during operation of the CPU (10D), the first test control circuit (100) or the CPU (10D) controls the selection circuit (501) so as to select the CPU (10D) to be tested. When a diagnosis result of the CPU (10D) is normal, the system control circuit (15) restarts the CPU (10D) (S424). After the restart, the CPU (10D) resumes the suspended processing (S425).

When an error by each self-diagnosis is notified from the comparison circuit (209) or the timer (205), the system control circuit (15) promptly performs processing to stop the system and thereby stops the system (S427).

As a method of performing a self-diagnosis (diagnosis at startup) of each of the CPUs (10A to 10D) on a regular basis at the timings that do not coincide with each other, any method may be employed. For example, a notification of interrupt may be given from the timer to the CPU (10A) at regular intervals, and the CPU (10A) may perform a self-diagnosis in response to the interrupt from the timer. Then, when resuming the operation after the restart, each of the CPUs (10A to 10C) may give a notification of CPU interrupt to each of the CPUs (10B to 10D) to perform a self-diagnosis next, and each of the CPUs (10B to 10D) may perform a self-diagnosis in response to the CPU interrupt. On the other hand, a notification of interrupt may be given from a plurality of timers respectively corresponding to the CPUs (10A to 10D) to each of the CPUs (10A to 10D) on a regular basis at the timings when a self-diagnosis (diagnosis at startup) does not coincide, and each of the CPUs (10A to 10D) may perform a self-diagnosis in response to the interrupt from the timer.

[Features and Effects]

The seventh embodiment shows the configuration in which LF and SPF are detected in the semiconductor device (1G) with multiple CPUs, and the first test control device (3), the second test control device (4) and the common result determination device (5) are used in common among a plurality of CPUs. Specifically, the first test control device (3) and the second test control device (4) perform a scan test of each of the plurality of CPUs (10A to 10D) in a specified order. It is thereby possible to reduce the circuit area. Further, the features and effects of the first embodiment are also obtained, and because the number of CPUs for diagnosis does not increase with the number of CPUs to be mounted, the area and power reduction effects by the seventh embodiment become higher as the number of CPUs increases.

<Eighth Embodiment>

An eighth embodiment is described hereinbelow. In the following description of the eighth embodiment, the same elements as in the first embodiment described above are denoted by the same reference symbols or the like, and the explanation of the same is omitted as appropriate.

[Configuration]

[Overall Configuration]

Figure 15:
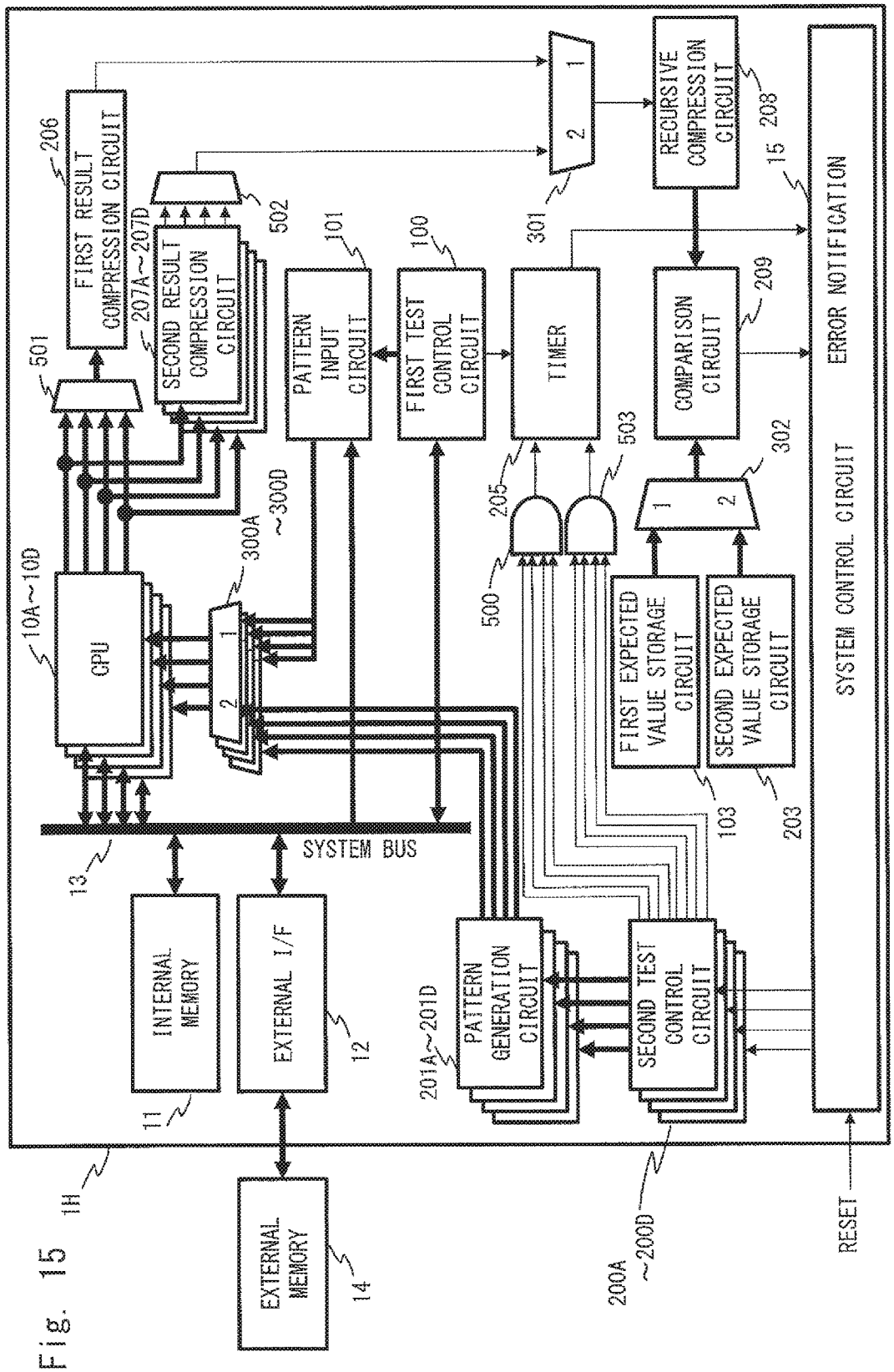
FIG. 15 is a block diagram showing the configuration of a semiconductor device according to an eighth embodiment.

The configuration of a semiconductor device (1H) according to the eighth embodiment is described hereinafter with reference to FIG. 15. FIG. 15 is a block diagram showing the configuration of the semiconductor device (1H) according to the eighth embodiment. As shown in FIG. 15, the semiconductor device (1G) is different from the semiconductor device (1A) according to the first embodiment in that it includes a plurality of CPUs (10A, 10B, 10C, 10D), a plurality of second test control circuits (200A to 200D), a plurality of pattern generation circuits (201A to 201D), a plurality of result compression circuits (207A to 207D), and a plurality of selection circuits (300A to 300D). Further, the semiconductor device (1G) is different from the semiconductor device (1A) according to the first embodiment in that it further includes an AND gate (500), a selection circuit (501), a selection circuit (502), and an AND gate (503).

Each of the CPUs (10A to 10D) is the same as the CPU (10) according to the first embodiment, and the description thereof is omitted. Specifically, the semiconductor device (1H) employs a multiprocessor configuration on which a plurality of CPUs with the same structure are mounted.

Each of the second test control circuits (200A to 200D) is the same as the second test control circuit (200) according to the first embodiment, and the description thereof is omitted. Specifically, the semiconductor device (1H) employs a multiprocessor configuration on which a plurality of CPUs with the same structure are mounted.

Each of the pattern generation circuits (201A to 201D) is the same as the pattern generation circuit (201) according to the first embodiment, and the description thereof is omitted. Each of the second result compression circuits (207A to 207D) is the same as the second result compression circuit (207) according to the first embodiment, and the description thereof is omitted. Each of the selection circuits (300A to 300D) is the same as the selection circuit (300) according to the first embodiment, and the description thereof is omitted.

The AND gate 500 calculates AND of initiation notification signals respectively output from the plurality of second test control circuits (200A to 200D), and outputs a signal, which is a calculation result, as an initiation notification signal to the timer (205). Further, the AND gate 504 calculates AND of termination notification signals respectively output from the plurality of second test control circuits (200A to 200D), and outputs a signal, which is a calculation result, as a termination notification signal to the timer (205).

In the eighth embodiment, differently from the seventh embodiment, test results that are output from the CPUs (10A to 10D) are respectively input to the second result compression circuits (207A to 207D) without through the selection circuit (501). Thus, the selection circuit (501) according to the eighth embodiment is different from the selection circuit (501) according to the seventh embodiment in that it outputs test results not to the second result compression circuits (207A to 207D) but to the first result compression circuit (206). Thus, control of the selection circuit (501) is not needed when initiating the diagnosis at startup.

The selection circuit (502) selectively outputs the test result that is output from any one of the plurality of result compression circuits (207A to 207D) to the selection circuit (301).

[First Test Control Device (3)]

The first test control circuit (100) is connected to each of the CPUs (10A to 10D) through the system bus (13). The first test control circuit (100) performs a scan test of the CPU (10A) in response to a request from the CPU (10A), performs a scan test of the CPU (10B) in response to a request from the CPU (10B), performs a scan test of the CPU (10C) in response to a request from the CPU (10C), and performs a scan test of the CPU (10D) in response to a request from the CPU (10D).

Each of the CPUs (10A to 10D) is connected to the pattern input circuit (101) and each of the pattern generation circuits (201A to 201D) through the selection circuits (300A to 300D). Specifically, the test patterns output from the pattern generation circuits (201A to 201D) are respectively input to the CPUs (10A to 10D) through the selection circuits (300A to 300D).

The pattern input circuit (101) outputs test patterns to each of all the selection circuits (300A to 300D). The test patterns output from the pattern input circuit (101) are input to all the CPUs (10A to 10D) through each of the selection circuits (300A to 300D).

When performing a scan test, the first test control circuit (100) asserts a scan enable signal that is to be output to a CPU to be tested, and continuously negates scan enable signals that are to be output to the other CPUs, among scan enable signals to be respectively output to the CPUs (10A to 10D). It is thereby possible to perform a scan test only on a CPU to be tested, and a CPU that is not to be tested can continue the normal operation, just like in the seventh embodiment.

[Second Test Control Device (4)]

The second test control circuits (200A to 200D) are connected to the system control circuit (15). The second test control circuit (200A) performs a scan test of the CPU (10A) in response to a request from the system control circuit (15). The second test control circuit (200B) performs a scan test of the CPU (10B) in response to a request from the system control circuit (15). The second test control circuit (200C) performs a scan test of the CPU (10C) in response to a request from the system control circuit (15). The second test control circuit (200D) performs a scan test of the CPU (10D) in response to a request from the system control circuit (15).

The second result compression circuits (207A to 207D) are respectively connected to the CPUs (10A to 10D). The second result compression circuit (207A) compresses test results output from the scan chains of the CPU (10A), just like the second result compression circuit (207) according to the first embodiment. The second result compression circuit (207B) compresses test results output from the scan chains of the CPU (10B), just like the second result compression circuit (207) according to the first embodiment. The second result compression circuit (207C) compresses test results output from the scan chains of the CPU (10C), just like the second result compression circuit (207) according to the first embodiment. The second result compression circuit (207D) compresses test results output from the scan chains of the CPU (10D), just like the second result compression circuit (207) according to the first embodiment.

[Common Result Determination Device (5)]

The AND gate (500) calculates AND of initiation notification signals respectively output from the second test control circuits (200A to 200D), and outputs an initiation notification signal, which is a calculation result, to the timer (205). The timer (205) thereby initiates the measurement of an elapsed time from the time when all of the second test control circuits (200A to 200D) output the initiation notification signals.

Further, the AND gate (503) calculates AND of termination notification signals respectively output from the second test control circuits (200A to 200D), and outputs a termination notification signal, which is a calculation result, to the timer (205). The timer (205) thereby terminates the measurement of an elapsed time when all of the second test control circuits (200A to 200D) output the termination notification signal.

[Operation]

Figure 16:
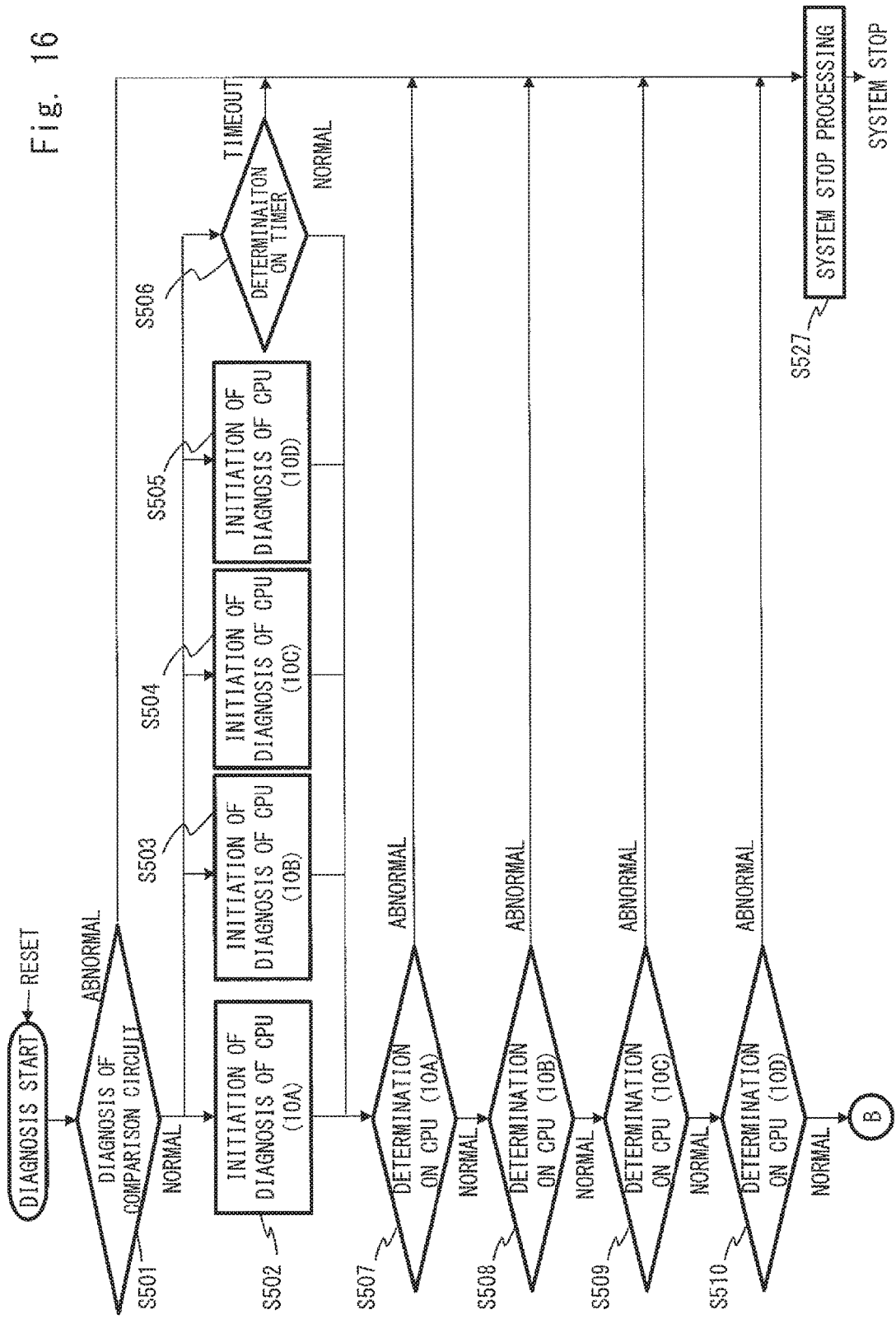
FIG. 16 is a block diagram showing the first-half operation of the semiconductor device according to the eighth embodiment.
Figure 17:
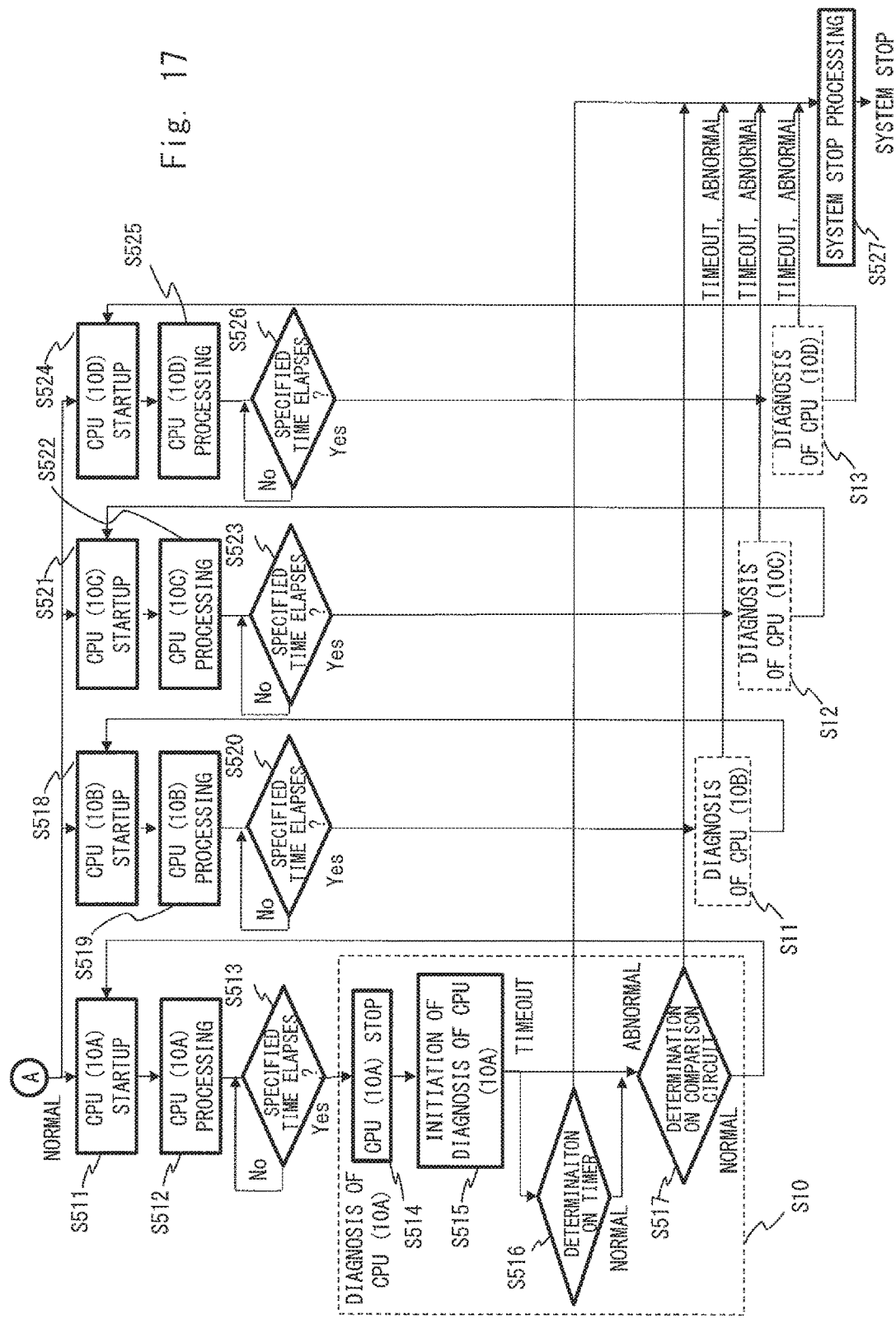
FIG. 17 is a block diagram showing the second-half operation of the semiconductor device according to the eighth embodiment.

The operation during self-diagnosis of the semiconductor device (1H) according to the eighth embodiment is described hereinafter with reference to FIGS. 16 and 17. FIGS. 16 and 17 are flowcharts showing the operation during self-diagnosis of the semiconductor device (1H) according to the eighth embodiment.

In FIGS. 16 and 17, operational events are connected by arrows, and events are performed in chronological order according to the orientation of arrows. A branching arrow indicates parallel execution of processing. Note that a rhombus-shaped event represents conditional branching. In a rhombus-shaped operational event, a downward-facing arrow basically indicates the next processing when a result is normal for the event, and a rightward-facing arrow basically indicates the next processing when a result is abnormal for the event. The operation according to the eighth embodiment is described with reference to the example of the semiconductor device (1H) shown in FIG. 15 and the operation flow shown in FIGS. 16 and 17.

[Overall Operation Flow]

When the semiconductor device (1H) is powered on and the reset of the second test control device (4) and the common result determination device (5) is cancelled, the semiconductor device (1H) makes a diagnosis for detecting LF first. For the detection of LF, the plurality of second test control devices (4) and the common result determination device (5) are used, and the diagnosis at startup of each of the CPUs (10A to 10D) is simultaneously carried out in parallel, except for determination of test results. When LF is not detected, the semiconductor device (1H) starts the normal operation.

Further, during the normal operation, the semiconductor device (1H) suspends the processing of any one of the CPUs (10A to 10D) and makes the diagnosis during operation for detecting SPF in the CPU whose processing is suspended at regular intervals. When SPF is not detected, the semiconductor device (1H) allows the CPU on which the diagnosis at startup is performed to resume the normal operation. Note that the diagnosis operation for detecting SPF is carried out on each of the CPUs (10A to 10D) in a specified order, and it is not carried out simultaneously on two or more CPUs.

[Diagnosis at Startup (LF Detection Flow)]

When the diagnosis at startup is initiated, the system control circuit (15) makes a diagnosis of the comparison circuit (209) (S501). The system control circuit (15) asserts a diagnosis initiation signal that gives an instruction to initiate a diagnosis of the comparison circuit (209) and outputs it to the second test control circuits (200A to 200D). In response to assertion of the diagnosis initiation signal that gives an instruction to initiate a diagnosis of the comparison circuit (209), the second test control circuits (200A to 200D) initiate a diagnosis of the comparison circuit (209). The operation in this Step S501 is substantially the same as the operation in Step S112 of FIG. 4 which is described in the modified example of the first embodiment, and the description thereof is omitted.

Further, the system control circuit (15) may output the asserted diagnosis initiation signal to any one of the second test control circuits (200A to 200D), and perform a scan test of one of the CPUs (10A to 10D) which corresponds to that second test control circuit and thereby make a diagnosis of the comparison circuit (209). Further, as described in the modified example of the first embodiment, the system control circuit (15) may control the comparison circuit (209) only to make a comparison of different values, without performing a scan test.

Then, the system control circuit (15) asserts a diagnosis initiation signal that gives an instruction to initiate a diagnosis of each of the CPUs (10A to 10D) and outputs it to each of the second test control circuits (200A to 200D). In response to assertion of the diagnosis initiation signal that gives an instruction to initiate a diagnosis of each of the CPUs (10A to 10D), each of the second test control circuits (200A to 200D) initiates a diagnosis of each of the CPUs (10A to 10D) (S502, S503, S504, S505). The specific operation in Step S502, S503, S504, S505 is the same as the operation in Step S101 of FIG. 3 in the first embodiment, and the description thereof is omitted.

In the eighth embodiment, however, the plurality of pattern generation circuits (201A to 201D) input test patterns in parallel into the plurality of CPUs (10A to 10D), respectively. Further, the second result compression circuits (207A to 207D) acquire test results from the scan chains of the plurality of CPUs (10A to 10D), respectively, and compress them.

Before initiating a diagnosis of each of the CPUs (10A to 10D), each of the second test control circuits (200A to 200D) starts the timer (205), just like in Step S102 of FIG. 3 in the first embodiment (S506). A specific determination and a notification in accordance with a determination result by the timer (205) are the same as those of Step S102 of FIG. 3 in the first embodiment, and the description thereof is omitted. Note that, however, in the eighth embodiment, differently from the first embodiment, the timer (205) initiates the measurement of an elapsed time when diagnosis initiation signals are output form all of the second test control circuits (200A to 200D) as described above.

After all scan results are compressed by the second result compression circuits (207A to 207D), a determination about test results is made sequentially in the order of: CPU (10A), CPU (10B), CPU (10C) and CPU (10D).

First, the second test control circuit (200A) or the second result compression circuit (207A) controls the selection circuit (502) to select the second result compression circuit (207A). The second result compression circuit (207A) corresponding to the CPU (10A) outputs the compressed test results serially one bit by one bit to the recursive compression circuit (208) through the selection circuit (502). The other second result compression circuits (207B to 207D) corresponding to the CPUs (10B to 10D) for which test results are not determined stop with the compressed test results held therein. The recursive compression circuit (208) recompresses the test results of the CPU (10A) from the second result compression circuit (207A). The comparison circuit (209) makes a determination on the test results compressed by the recursive compression circuit (208) (S507). Note that the specific operation in Step S507 is the same as Step S104 of FIG. 3 in the first embodiment, and the description thereof is omitted. The same applies to the operation on the CPU (10B to 10D), which is described later.

When a notification of error is given from the comparison circuit (209) as a diagnosis result of the CPU (10A) (S507: Abnormal), the system control circuit (15) promptly performs processing to stop the system and thereby stops the system (S527). In other words, the system control circuit (15) inhibits the starting of the semiconductor device (1H). The same applies to the operation on the CPU (10B to 10D), which is described later.

Next, the second test control circuit (200B) or the second result compression circuit (207B) controls the selection circuit (502) to select the second result compression circuit (207B). The second result compression circuit (207B) corresponding to the CPU (10B) outputs the compressed test results serially one bit by one bit to the recursive compression circuit (208) through the selection circuit (502). The other second result compression circuits (207C, 207D) corresponding to the CPUs (10C, 10D) for which test results are not determined stop with the compressed test results held therein. The recursive compression circuit (208) recompresses the test results of the CPU (10B) from the second result compression circuit (207B). The comparison circuit (209) makes a determination on the test results compressed by the recursive compression circuit (208) (S508).

Then, the second test control circuit (200C) or the second result compression circuit (207C) controls the selection circuit (502) to select the second result compression circuit (207C). The second result compression circuit (207C) corresponding to the CPU (10C) outputs the compressed test results serially one bit by one bit to the recursive compression circuit (208) through the selection circuit (502). The other second result compression circuit (207D) corresponding to the CPU (10D) for which test results are not determined stops with the compressed test results held therein. The recursive compression circuit (208) recompresses the test results of the CPU (10C) from the second result compression circuit (207C). The comparison circuit (209) makes a determination on the test results compressed by the recursive compression circuit (208) (S509).

After that, the second test control circuit (200D) or the second result compression circuit (207D) controls the selection circuit (502) to select the second result compression circuit (207D). The second result compression circuit (207D) corresponding to the CPU (10D) outputs the compressed test results serially one bit by one bit to the recursive compression circuit (208) through the selection circuit (502). The recursive compression circuit (208) recompresses the test results of the CPU (10D) from the second result compression circuit (207D). The comparison circuit (209) makes a determination on the test results compressed by the recursive compression circuit (208) (S510).

[Diagnosis During Startup (SPF Detection Flow)]

When the diagnosis results of all the CPUs (10A to 10D) are normal, the system control circuit (15) performs the operations of Steps S511 to S527 and S20 to S23. Note that the operations in Steps S511 to S527 and S20 to S23 are the same as the operations in Steps S411 to S427 and S10 to S13 in the seventh embodiment, and the description thereof is omitted.

[Features and Effects]

In the eighth embodiment, a device (the second test control device (4)) that performs a scan test for detecting LF is placed for each CPU, which is different from the seventh embodiment. Specifically, each of the plurality of second test control devices performs a scan test in the diagnosis at startup in parallel with one another. It is thus possible to simultaneously perform the detection of LF in a plurality of CPUs and thereby reduce a time needed for the diagnosis at startup.

Although embodiments of the present invention are described in the foregoing, the present invention is not restricted to the above-described embodiments, and various changes and modifications may be made without departing from the scope of the invention.

Note that, although an example in which a plurality of CPUs in a multiprocessor are used as a plurality of circuits to be tested is described in the seventh and eighth embodiments, the present invention is not limited thereto. A plurality of cores in a multi-core processor may be used instead. In other words, various arithmetic circuits may be used as circuits to be tested.

Further, although an example in which the diagnosis at startup is not performed simultaneously on two or more CPUs is described in the seventh and eighth embodiments, the present invention is not limited thereto. The diagnosis at startup may be performed simultaneously on two or more (e.g., two or three) CPUs. Preferably, however, the diagnosis at startup is not performed simultaneously on two or more CPUs as described above, so that the degradation of system performance during the diagnosis at startup is reduced.

Further, although an example in which the diagnosis at startup is performed after the startup of the semiconductor device (1C) only on the circuits to be tested (50, 60) on which the diagnosis at startup has not been performed during the startup of the semiconductor device (1C) is described in the third embodiment, the present invention is not limited thereto. For example, the diagnosis at startup may be performed after the startup of the semiconductor device (1C) also on the circuit to be tested (40) on which the diagnosis at startup has been performed during the startup of the semiconductor device (1C). For example, the system control circuit (15) negates a diagnosis initiation signal for the second test control device (52) after the diagnosis at startup of the circuit to be tested (40) is terminated. Then, after the startup of the semiconductor device (1C), the circuit to be tested (40) may output the asserted diagnosis initiation signal, through the system bus (13), to each of the second test control devices (42, 52, 62) corresponding to the circuits to be tested (40, 50, 60) including itself.

REFERENCE SIGNS LIST

1, 1A, 1B, 1C, 1D, 1E, 1F, 1G, 1H SEMICONDUCTOR DEVICE
2, 40, 50, 60 CIRCUIT TO BE TESTED
3, 41, 51, 61 FIRST TEST CONTROL DEVICE
4, 42, 52, 62 SECOND TEST CONTROL DEVICE
5, 43, 53, 63 COMMON RESULT DETERMINATION DEVICE
10, 10A, 10B, 10C, 10D CPU
11 INTERNAL MEMORY
12 EXTERNAL I/F
13 SYSTEM BUS
14 EXTERNAL MEMORY
15 SYSTEM CONTROL CIRCUIT
16, 17 CUTOFF CIRCUIT
20 OPERATING DIAGNOSIS DEVICE
44, 54, 64, 500 AND GATE
45, 55, 65 OR GATE
70 TEST TARGET SETTING CIRCUIT
100 FIRST TEST CONTROL CIRCUIT
101 PATTERN INPUT CIRCUIT
102 FIRST RESULT DETERMINATION CIRCUIT
103 FIRST EXPECTED VALUE STORAGE CIRCUIT
104 FIRST TIMER
200, 200A, 200B, 200C, 200D SECOND TEST CONTROL CIRCUIT
201, 201A, 201B, 201C, 201D PATTERN GENERATION CIRCUIT
202 SECOND RESULT DETERMINATION CIRCUIT
203 SECOND EXPECTED VALUE STORAGE CIRCUIT
204 SECOND TIMER
205 TIMER
206 FIRST RESULT COMPRESSION CIRCUIT
207, 207A, 207B, 207C, 207D SECOND RESULT COMPRESSION CIRCUIT
208 RECURSIVE COMPRESSION CIRCUIT
209 COMPARISON CIRCUIT
203 SECOND EXPECTED VALUE STORAGE CIRCUIT
300, 300A, 300B, 300C, 300D, 301, 302, 401, 402, 501, 502 SELECTION CIRCUIT
400 ROM
600 TEST CONTROL CIRCUIT
601 PATTERN INPUT CIRCUIT
602 RESULT DETERMINATION CIRCUIT
603 EXPECTED VALUE STORAGE CIRCUIT

The invention claimed is:

1. A semiconductor device comprising:
 a circuit to be tested having a scan chain; and
 a first test control device and a second test control device that each selectively performs a scan test of the circuit to be tested by using the scan chain,
 wherein
 the second test control device performs an initial scan test of the circuit to be tested,
 the circuit to be tested gives the first test control device an instruction to perform a subsequent scan test after the initial scan test is performed, and
 the first test control device performs the subsequent scan test of the circuit to be tested in response to an instruction from the circuit to be tested.

2. The semiconductor device according to claim 1, wherein the second test control device performs the initial scan test by generating a test pattern and inputting the test pattern into the scan chain at a startup of the semiconductor device, and the first test control device performs the subsequent scan test by acquiring a test pattern from an external storage circuit connected to the semiconductor device and inputting the test pattern into the scan chain after a completion of the startup of the semiconductor device.

3. The semiconductor device according to claim 2, further comprising:
  a result determination device that determines a test result acquired from the circuit to be tested by each of the initial scan test and the subsequent scan test.

4. The semiconductor device according to claim 1, further comprising:
  a timer that measures an execution time of the scan test, and notifies an error when the measured execution time exceeds a specified threshold,
  wherein each of the first test control device and the second test control device gives the timer an instruction to start measurement of the execution time when initiating a scan test of the circuit to be tested, and gives the timer an instruction to end measurement of the execution time when a scan test of the circuit to be tested ends.

5. The semiconductor device according to claim 1, further comprising:
  a second expected value storage unit that stores a second expected value being an expected value for a test result acquired from the circuit to be tested by the initial scan test performed by the second test control device;
  a result determination device that compares an initial test result acquired from the circuit to be tested by the initial scan test with the second expected value stored in the second expected value storage unit, determines that the result is normal when they match, and determines that the result is an error when they do not match; and
  a system control circuit that controls the semiconductor device in accordance with a determination result of the result determination device,
  wherein the system control circuit causes the result determination device to compare the values before the subsequent scan test is performed and stops operation of the semiconductor device when it is determined that the values do not match.

6. The semiconductor device according to claim 1, comprising:
  a plurality of circuits to be tested; and
  a corresponding plurality of second test control devices that each initially performs a scan test of its associated circuit of the plurality of circuits to be tested, wherein each of the plurality of second test control devices performs the initial scan test at a startup of the semiconductor device, the first test control device performs the subsequent scan test after the startup of the semiconductor device,
  the semiconductor device further includes a test target setting circuit that stores a test target value indicating whether each of the plurality of circuits to be tested is a target of the initial scan test at startup of the semiconductor device, and
  each of the plurality of second test control devices performs the initial scan test in accordance with the test target value.

7. The semiconductor device according to claim 6, wherein each of the plurality of circuits to be tested is started after the initial scan test is performed, and executes processing including giving an instruction for the subsequent scan test,
  a circuit to be tested designated as a target of the initial scan test by the test target value gives an instruction to perform the initial scan test for a second test control device corresponding to a specified circuit to be tested among circuits to be tested not designated as a target of the initial scan test by the test target value.

8. The semiconductor device according to claim 1, wherein the second test control device performs a scan test of the first test control device in addition to the circuit to be tested.

9. The semiconductor device according to claim 1, wherein the first test control device and the second test control device comprise a single test control device, and the semiconductor device further includes:
  a system bus that is used when the test control device acquires a test pattern to be input to the scan chain in the first scan test from an external storage circuit connected to the semiconductor device; and
  an internal storage circuit that stores a test pattern to be input to the scan chain in the second scan test,
  wherein the test control device acquires the test pattern from the internal storage circuit, inputs the acquired test pattern into the scan chain and performs the initial scan test during an initialization of the system bus, and
  wherein the test control device acquires the test pattern from the external storage circuit through system bus, inputs the acquired test pattern into the scan chain and performs the subsequent scan test after the initialization of the system bus.

10. The semiconductor device according to claim 1, wherein the first test control device and the second test control device comprise a single test control device and the semiconductor device further includes:
  a system bus that is used when the test control device acquires a test pattern to be input to the scan chain in the subsequent scan test and the initial scan test from an external storage circuit connected to the semiconductor device; and
  an external interface circuit that is used when the test control device acquires the test pattern from the external storage circuit without through the system bus,
  wherein the test control device acquires the test pattern from the external storage circuit through the external interface circuit, inputs the acquired test pattern into the scan chain, and performs the initial scan test during an initialization of the system bus, and
  wherein the test control device acquires the test pattern from the external storage circuit through the system bus, inputs the acquired test pattern into the scan chain, and performs the subsequent scan test after the initialization of the system bus.

11. The semiconductor device according to claim 1, comprising:
  a plurality of circuits to be tested,
  wherein the first test control device and the second test control device perform a scan test of each of the plurality of circuits to be tested in a specified order.

12. The semiconductor device according to claim 1, comprising:
  a plurality of circuits to be tested; and
  a corresponding plurality of second test control devices that respectively performs an initial scan test of its associated circuit of the plurality of circuits to be tested,
  wherein each of the plurality of second test control devices performs its initial scan test at a startup of the semiconductor device, the first test control device performs the subsequent scan test after the startup of the semiconductor device, and each of the plurality of second test control devices performs its initial scan test in parallel with one another.

13. The semiconductor device according to claim 1,
wherein the initial scan test performed by the second test control device comprises a scan test to detect a latent fault being a failure due to a simultaneous occurrence of multiple faults, and
wherein the subsequent scan test performed by the first test control device comprises a scan test to detect a single-point fault being a failure due to a single fault.

14. The semiconductor device according to claim 13, wherein the latent fault comprises a fault that would prevent an initiation of the subsequent scan test performed by the first test control device.

15. A diagnostic test method comprising:
performing, by a second test control device, an initial scan test of a circuit to be tested, by using a scan chain of the circuit to be tested;
giving, by the circuit to be tested, a first test control device an instruction to perform a subsequent scan test after the initial scan test by the second test control device is performed; and
performing, by the first test control device, a subsequent scan test of the circuit to be tested by using the scan chain of the circuit to be tested in response to an instruction from the circuit to be tested.

16. The diagnostic test method according to claim 15,
wherein the initial scan test performed by the second test control device comprises a scan test to detect a latent fault being a failure due to a simultaneous occurrence of multiple faults, and
wherein the subsequent scan test performed by the first test control device comprises a scan test to detect a single-point fault being a failure due to a single fault.

17. The diagnostic test method according to claim 16, wherein the latent fault comprises a fault that would prevent an initiation of the subsequent scan test performed by the first test control device.

18. The diagnostic test method according to claim 15, further comprising measuring an execution time of the scan tests, and notifying an error when the measured execution time exceeds a specified threshold,
wherein each of the first test control device and the second test control device gives an instruction to start measurement of the execution time when initiating a scan test of the circuit to be tested and gives the timer an instruction to end measurement of the execution time when a scan test of the circuit to be tested ends.

19. A diagnostic test method for testing a circuit, the diagnostic test method comprising:
performing an initial scan test of the circuit to be tested, the initial scan test detecting a latent fault that would prevent a subsequent scan test of the circuit to be tested, the subsequent scan test for detecting a single point failure that would prevent a normal function of the circuit to be tested; and
stopping an operation of the circuit to be tested when a result of the initial scan test detects a latent fault;
giving an instruction to perform a subsequent scan test when the initial scan test is performed and no latent fault is detected; and
based on receiving the instruction to perform the subsequent scan test, performing the subsequent scan test of the circuit to be tested.

20. The diagnostic test method according to claim 19, further comprising measuring an execution time of the scan tests, and notifying an error when the measured execution time exceeds a specified threshold,
wherein each of the initial scan test and the subsequent scan test starts a measurement of the execution time when initiating a scan test of the circuit to be tested and gives the timer an instruction to end measurement of the execution time when a scan test of the circuit to be tested ends.

* * * * *